(12) United States Patent
Murata et al.

(10) Patent No.: US 12,476,196 B2
(45) Date of Patent: Nov. 18, 2025

(54) SEMICONDUCTOR DEVICE AND SEMICONDUCTOR DEVICE MANUFACTURING METHOD

(71) Applicant: FUJI ELECTRIC CO., LTD., Kawasaki (JP)

(72) Inventors: Yuma Murata, Matsumoto (JP); Ryoichi Kato, Matsumoto (JP); Shinji Tada, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 487 days.

(21) Appl. No.: 17/896,637

(22) Filed: Aug. 26, 2022

(65) Prior Publication Data

US 2023/0120152 A1    Apr. 20, 2023

(30) Foreign Application Priority Data

Oct. 20, 2021   (JP) .................. 2021-171318

(51) Int. Cl.
| | |
|---|---|
| *H01L 23/04* | (2006.01) |
| *H01L 23/02* | (2006.01) |
| *H01L 23/498* | (2006.01) |
| *H01L 23/538* | (2006.01) |
| *H01L 23/66* | (2006.01) |

(52) U.S. Cl.
CPC .......... *H01L 23/5385* (2013.01); *H01L 23/02* (2013.01); *H01L 23/49811* (2013.01); *H01L 23/49838* (2013.01); *H01L 23/66* (2013.01)

(58) Field of Classification Search
CPC ........................... H01L 23/3735; H01L 23/04
See application file for complete search history.

(56) References Cited

U.S. PATENT DOCUMENTS

| | | | |
|---|---|---|---|
| 2003/0133318 A1* | 7/2003 | Radosevich | ............ H02M 1/44 363/131 |
| 2008/0049476 A1 | 2/2008 | Azuma et al. | |

(Continued)

FOREIGN PATENT DOCUMENTS

| | | |
|---|---|---|
| EP | 2015626 A2 | 1/2009 |
| JP | H11-261049 A | 9/1999 |

(Continued)

OTHER PUBLICATIONS

Japanese Patent Office Action issued for corresponding JP Patent Application No. 2021-171318 on Jul. 29, 2025.

*Primary Examiner* — Michele Fan

(74) *Attorney, Agent, or Firm* — Rabin & Berdo, P.C

(57) ABSTRACT

A semiconductor module includes a first case having a first side face, a first insulating paper disposed on the first case and having a first width in a first direction and having a notch with a second width smaller than the first width, a first terminal between the first case and the first insulating paper, having an exposed portion exposed from the first insulating paper at an area where the notch is formed, and a second terminal on the first insulating paper at a side opposite to a side where the first terminal is disposed. The first terminal and the first insulating paper have extended portions extending to an outside of the first case from the first side face so that a portion of the first insulating paper where the notch is formed and the exposed portion of the first terminal are located at the outside of the first case.

13 Claims, 15 Drawing Sheets

(56) References Cited

U.S. PATENT DOCUMENTS

| | | |
|---|---|---|
| 2009/0002956 A1 | 1/2009 | Suwa et al. |
| 2015/0131232 A1 | 5/2015 | Ishino et al. |
| 2016/0366778 A1 | 12/2016 | Liu et al. |
| 2021/0202372 A1 | 7/2021 | Kato et al. |

FOREIGN PATENT DOCUMENTS

| | | |
|---|---|---|
| JP | 2007-234694 A | 9/2007 |
| JP | 2007234693 A | 9/2007 |
| JP | 2008306867 A | 12/2008 |
| JP | 2009-005512 A | 1/2009 |
| JP | 2012-055163 A | 3/2012 |
| JP | 2021-106235 A | 7/2021 |
| WO | 2014/002442 A1 | 1/2014 |

* cited by examiner

SEMICONDUCTOR DEVICE AND SEMICONDUCTOR DEVICE MANUFACTURING METHOD

CROSS-REFERENCE TO RELATED APPLICATION

This application is based upon and claims the benefit of priority of the prior Japanese Patent Application No. 2021-171318, filed on Oct. 20, 2021, the entire contents of which are incorporated herein by reference.

BACKGROUND OF THE INVENTION

1. Field of the Invention

The embodiments discussed herein relate to a semiconductor device and a semiconductor device manufacturing method.

2. Background of the Related Art

With semiconductor devices, a technique for connecting a power module including a power semiconductor element and a capacitor module including a capacitor element, a technique for laminating a positive electrode terminal and a negative electrode terminal on the power module side with an insulating material therebetween, a technique for making the insulating material protrude from a surrounding resin portion for the purpose of ensuring creepage distance, or the like is known (see, for example, Japanese Laid-open Patent Publication No. 2012-55163).

Furthermore, a technique for locating in parallel a positive-side external electrode and a negative-side external electrode of a semiconductor module connected to a plus terminal and a minus terminal, respectively, of a capacitor with an insulating material having a width greater than that of the positive-side external electrode and the negative-side external electrode therebetween is known (see, for example, Japanese Laid-open Patent Publication No. 2007-234694).

In addition, a technique for locating an insulating material, such as insulating paper, between a positive planar terminal and a negative planar terminal connected to a silicon die in a housing, extending from the housing, and connected to a capacitor for the purpose of insulating the planar terminals from each other across the whole of the width of conductive sheets of which the planar terminals are made is known (see, for example, US Patent Application Publication 2016/0366778).

Moreover, a technique for superimposing one of a positive-side main electrode and a negative-side main electrode of a power module, which are connected via direct-current bus bars to electrodes of a smoothing capacitor and which have the shape of a flat plate short in a direction in which a current flows and long in a direction perpendicular to the direction in which a current flows, over the other with an insulating plate therebetween is known (see, for example, Japanese Laid-open Patent Publication No. 2009-5512).

Furthermore, a technique for connecting a positive electrode terminal and a negative electrode terminal to an upper radiation plate and a lower radiation plate, respectively, each having one surface which faces a semiconductor chip of a three-phase inverter and the other surface exposed from a resin molded portion, locating the positive electrode terminal and the negative electrode terminal opposite each other with an insulating film which is a size larger than the positive electrode terminal and the negative electrode terminal therebetween, exposing portions of the positive electrode terminal and the negative electrode terminal from the resin molded portion, and connecting connecting portions of a smoothing capacitor to the portions of the positive electrode terminal and the negative electrode terminal is known (see, for example, International Publication Pamphlet No. WO 2014/002442).

In addition, a technique for locating on a cooling fin a semiconductor switching element having a ring-shaped gate terminal and an anode electrode and a cathode electrode at the upper and lower ends respectively, connecting the cathode electrode to the cooling fin, and connecting a cathode spacer ring located on an upper surface of the cooling fin and the ring-shaped gate terminal via a wiring substrate formed by laminating two pairs of conductive layers in each of which a current flows in opposite directions is known (see, for example, Japanese Laid-open Patent Publication No. 11-261049).

Moreover, the following semiconductor device is known. The semiconductor device includes a terminal laminated portion formed by putting in order a first power terminal, a first insulating sheet, and a second power terminal one over another. The first power terminal has a first bonding area conductively connected to a first connection terminal of a capacitor. The second power terminal has a second bonding area conductively connected to a second connection terminal of the capacitor. The first insulating sheet has a terrace portion extending in plan view in a direction from the second bonding area to the first bonding area (see, for example, Japanese Laid-open Patent Publication No. 2021-106235).

With respect to a semiconductor device including a semiconductor module connected to a capacitor, a technique for forming a laminated structure in which an insulating paper is put between a positive electrode terminal and a negative electrode terminal of the semiconductor module connected to the capacitor is known.

The following semiconductor module is taken as an example of the above semiconductor module. A laminated structure of a positive electrode terminal, an insulating paper, and a negative electrode terminal is formed on an edge portion of a case which houses a semiconductor element so that a part of the positive electrode terminal and a part of the negative electrode terminal will be exposed from the case. A positive electrode terminal and a negative electrode terminal of a capacitor (or bus bars or the like connected thereto) are connected to the positive electrode terminal and the negative electrode terminal, respectively, of this semiconductor module so that the insulating paper will be put between portions at which the positive electrode terminals and the negative electrode terminals are connected. By doing so, a semiconductor device is realized.

In this semiconductor device, a reduction in inductance at the portions at which the positive electrode terminals and the negative electrode terminals of the semiconductor module and the capacitor are connected is effective in reducing switching loss which occurs when the semiconductor module operates. With conventional semiconductor devices, however, there are cases where inductance at portions at which positive electrode terminals and negative electrode terminals of a semiconductor module and a capacitor are connected is not sufficiently reduced. Furthermore, when a structure for reducing inductance is adopted, for example, when the width of one of a positive electrode terminal and a negative electrode terminal is expanded to increase the cross-sectional area, then it may be impossible to ensure insulation distance between portions at which positive electrode terminals and negative electrode terminals are connected.

SUMMARY OF THE INVENTION

According to an aspect, there is provided a semiconductor device including a semiconductor module including: a first case having a first side face; a first insulating paper disposed on the first case, and having a first width in a first direction that is parallel to the first side face, the first insulating paper having a notch that is concave from the first side face toward an inside of the first case in a second direction orthogonal to the first direction and the first side face and that has a second width in the first direction that is smaller than the first width; a first terminal disposed between the first case and the first insulating paper and having an exposed portion that is exposed from the first insulating paper at an area where the notch is formed, the first terminal having a third width in the first direction that is smaller than the first width and larger than the second width; and a second terminal disposed on the first insulating paper at a side opposite to a side at which the first terminal is disposed, wherein: the first terminal has an extended portion that extends in the second direction to an outside of the first case from the first side face, and the first insulating paper has an extended portion that extends in the second direction to the outside of the first case from the first side face, so that a portion of the first insulating paper where the notch is formed and the exposed portion of the first terminal are both located at the outside of the first case.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

First Embodiment

Figure 1:
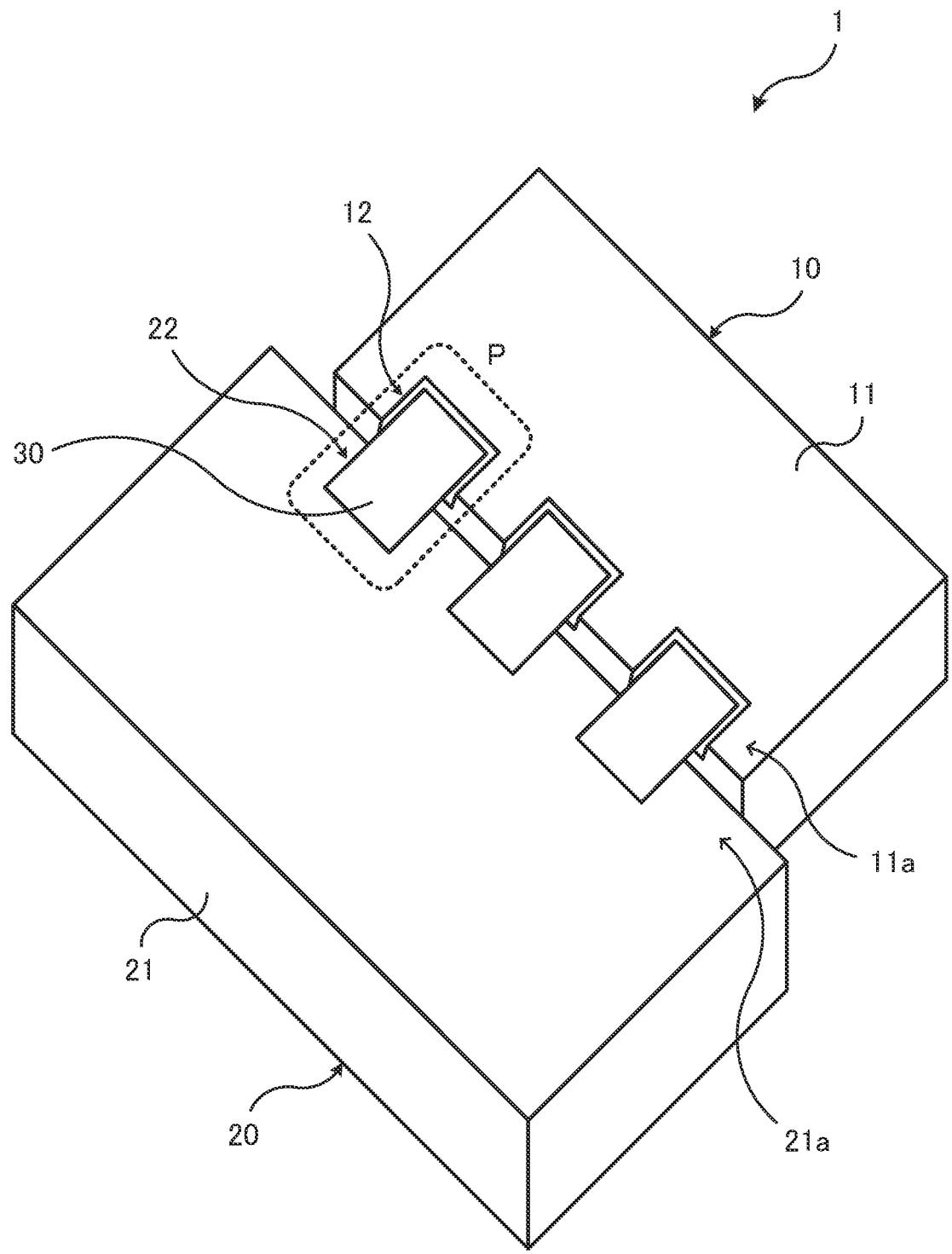
FIG. 1 is a view for describing an example of a semiconductor device according to a first embodiment.

FIG. 1 is a view for describing an example of a semiconductor device according to a first embodiment. FIG. 1 is a fragmentary schematic perspective view of an example of a semiconductor device.

A semiconductor device 1 illustrated in FIG. 1 includes a semiconductor module 10, a capacitor 20, and a connecting member 30 which connects them.

The semiconductor module 10 includes a first case 11. An insulating board and semiconductor elements and the like mounted over the insulating board are housed in the first case 11 of the semiconductor module 10.

A material, such as polyphenylene sulfide (PPS) resin, polybutylene terephthalate (PBT) resin, polybutylene succinate (PBS) resin, polyamide (PA) resin, or acrylonitrile butadiene styrene (ABS) resin, is used for forming the first case 11 of the semiconductor module 10. Such a material is used and the first case 11 is formed by injection molding or the like.

For example, a conductor layer having a determined pattern is formed over both principal planes of a ceramic board and such a ceramic board is used as the insulating board housed in the first case 11 of the semiconductor module 10. A board made of alumina, a board made of a composite ceramic material containing alumina as a main ingredient, a board made of aluminum nitride, a board made of silicon nitride, or the like is used as a ceramic board. Metal, such as copper or aluminum, is used for forming the conductor layer. A direct copper bonding (DCB) substrate, an active metal brazed (AMB) substrate, or the like is used as the insulating board.

The semiconductor elements mounted over the insulating board housed in the first case 11 of the semiconductor module 10 are an insulated gate bipolar transistor (IGBT), a metal oxide semiconductor field effect transistor (MOSFET), and the like. Diodes, such as a free wheeling diode (FWD) and a Schottky barrier diode (SBD), may be used as the semiconductor elements. Such diodes and an IGBT and a MOSFET may be integrated as the semiconductor elements. Furthermore, terminal parts and the like connected to the semiconductor elements may be mounted over the insulating board.

A terminal structure portion 12 is located on a first edge portion 11a of the first case 11 of the semiconductor module 10 housing the above insulating board and the semiconductor elements and the like mounted over the insulating board. The first edge portion 11a corresponds to one side of the first case 11. The terminal structure portion 12 is connected to the insulating board and the semiconductor elements and the like housed in the first case 11 of the semiconductor module 10 and is used for connecting the semiconductor module 10 to the capacitor 20 outside the semiconductor module 10. FIG. 1 illustrates as an example the semiconductor module 10 in which three terminal structure portions 12 are located on the first edge portion 11a of the first case 11. The terminal structure portion 12 of the semiconductor module 10 will be described later.

The capacitor 20 includes a second case 21. A capacitor element is housed in the second case 21 of the capacitor 20.

A material, such as PPS resin, PBT resin, PBS resin, PA resin, or ABS resin, is used for forming the second case 21 of the capacitor 20. Such a material is used and the second case 21 is formed by injection molding or the like.

A terminal structure portion 22 is located on a second edge portion 21a of the second case 21 of the capacitor 20 housing the capacitor element. The second edge portion 21a corresponds to one side of the second case 21. The terminal structure portion 22 is connected to the capacitor element housed in the second case 21 of the capacitor 20 and is used for connecting the capacitor 20 to the semiconductor module 10 outside the capacitor 20. FIG. 1 illustrates as an example the capacitor 20 in which three terminal structure portions 22 are located on the second edge portion 21a of the second case 21. The terminal structure portion 22 of the capacitor 20 will be described later.

The semiconductor module 10 and the capacitor 20 are arranged so that the first edge portion 11a and the second edge portion 21a will be opposed to each other. The terminal structure portion 12 and the terminal structure portion 22 are connected by the use of a connecting member 30 such as a bus bar. The semiconductor module 10 and the capacitor 20 are connected in this way and the semiconductor device 1 is realized.

With the semiconductor device 1, the insulating board of the semiconductor module 10, the semiconductor elements and the like mounted over the insulating board, and the capacitor element of the capacitor 20 are used for forming a circuit, such as a power conversion circuit or an inverter circuit, having a determined function.

The terminal structure portion 12 of the semiconductor module 10 and the terminal structure portion 22 of the capacitor 20 included in the above semiconductor device 1 will be described further with reference to FIGS. 2 and 3 respectively.

First, the terminal structure portion 12 of the semiconductor module 10 will be described with reference to FIGS. 2A through 2C.

Figure 2A:
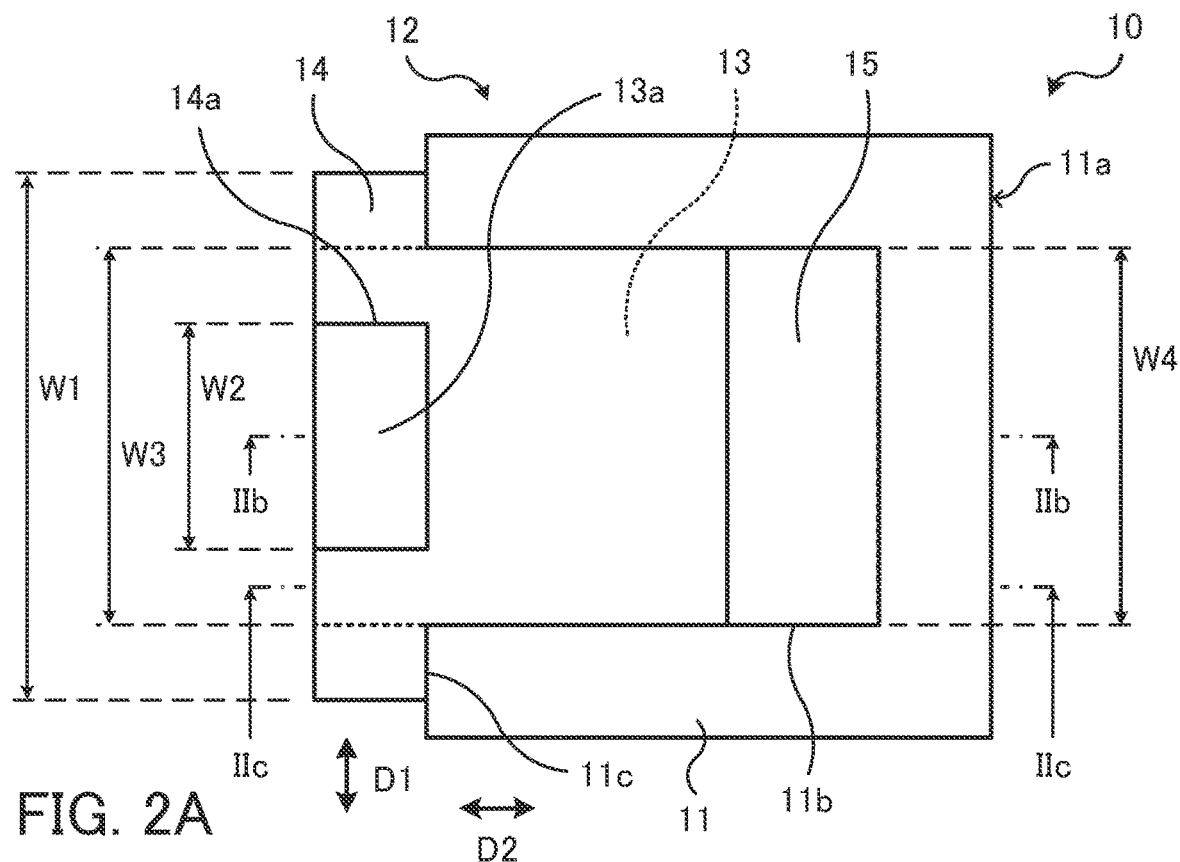
FIGS. 2A through 2C are views for describing an example of a terminal structure portion of a semiconductor module in the first embodiment.
Figure 2B:
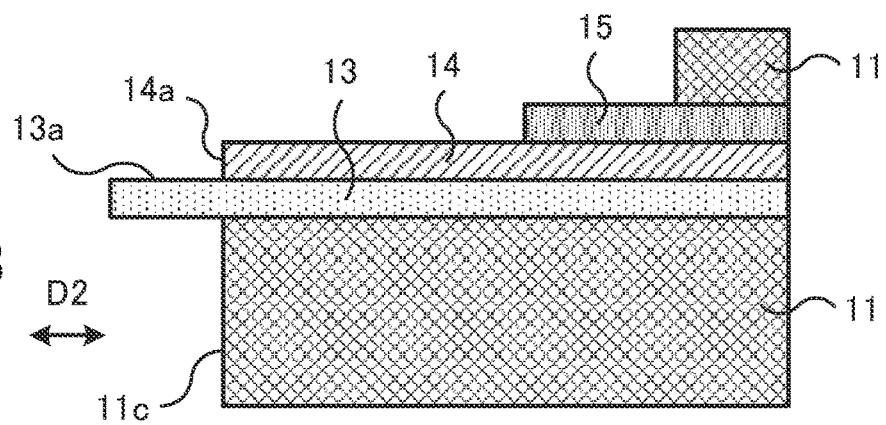
Figure 2C:
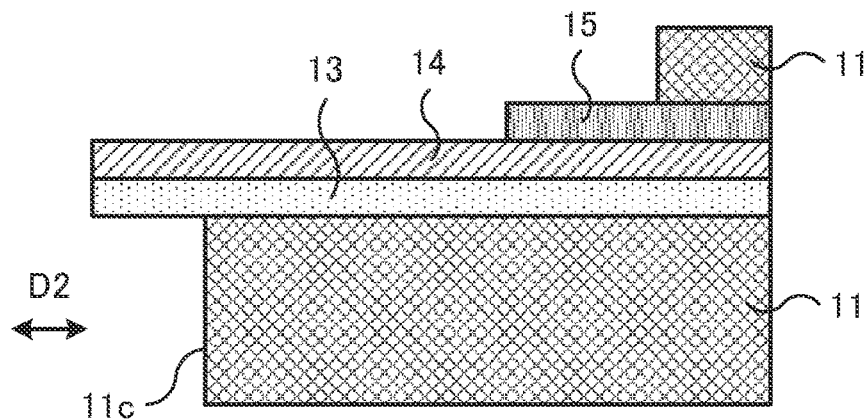

FIGS. 2A through 2C are views for describing an example of the terminal structure portion of the semiconductor module in the first embodiment. FIG. 2A is a fragmentary schematic plan view of an example of the terminal structure portion of the semiconductor module. FIG. 2B is a schematic sectional view taken along the line IIb-IIb of FIG. 2A. FIG. 2C is a schematic sectional view taken along the line IIc-IIc of FIG. 2A.

FIGS. 2A through 2C schematically illustrate an example of the terminal structure portion 12 of the semiconductor module 10 in the P portion illustrated in FIG. 1 and schematically illustrate an example of the terminal structure portion 12 of the semiconductor module 10 before connection to the capacitor 20.

As illustrated in FIGS. 2A through 2C, the first case 11 of the semiconductor module 10 has a concave portion 11b in the first edge portion 11a which communicates with the outside of the first case 11. The terminal structure portion 12 of the semiconductor module 10 is located on the first edge portion 11a of the first case 11 in which the concave portion 11b is formed.

As illustrated in FIGS. 2A through 2C, the terminal structure portion 12 of the semiconductor module 10 includes a first terminal 13, a first insulating paper 14, and a second terminal 15. The first terminal 13 and the second terminal 15 differ in polarity. For example, the first terminal 13 is a negative electrode (N) terminal of the semiconductor module 10 and the second terminal 15 is a positive electrode (P) terminal of the semiconductor module 10. The first terminal 13, the first insulating paper 14, and the second terminal 15 are laminated so that the first insulating paper 14 will intervene between the first terminal 13 and the second terminal 15. The first terminal 13 and the second terminal 15 are made of metal such as copper or aluminum. The first insulating paper 14 is made of a material such as PA resin, fluoroplastic, or polyimide resin. An end portion of each of the first terminal 13, the first insulating paper 14, and the second terminal 15 may be buried in a side wall portion of the concave portion 11b of the first case 11.

The first terminal 13 is located on the bottom of the concave portion 11b of the first case 11, that is to say, between the bottom of the concave portion 11b formed in the first edge portion 11a of the first case 11 and the first insulating paper 14. An end portion of an area of the first terminal 13 not covered with the first case 11 (not covered with the side wall portion of the concave portion 11b of the first case 11) extends from a side face (first side face) 11c of the first case 11 to the outside.

The first insulating paper 14 is located on the first terminal 13, that is to say, on a side of the first terminal 13 opposite to the bottom of the concave portion 11b formed in the first edge portion 11a of the first case 11. An end portion of an area of the first insulating paper 14 not covered with the first case 11 (not covered with the side wall portion of the concave portion 11b of the first case 11) extends from the side face 11c of the first case 11 to the outside. A notch 14a which is concave from the outside to the inside of the first case 11 is formed in the end portion of the first insulating paper 14. The notch 14a is formed in the end portion of the first insulating paper 14 extending from the first case 11 and has the shape of the letter "U" in plan view. A portion (referred to as a "connecting area") 13a of the first terminal 13 is exposed from the notch 14a of the first insulating paper 14. The first terminal 13 is covered with the first insulating paper 14 in a state in which the connecting area 13a is situated under the notch 14a of the first insulating paper 14. The first terminal 13 is covered with the first insulating paper 14 except the connecting area 13a which is situated under the notch 14a of the first insulating paper 14. The connecting area 13a of the first terminal 13 is formed as an area to which a third terminal 23 of the capacitor 20 described later is connected.

The second terminal 15 is located on the first insulating paper 14, that is to say, on a side of the first insulating paper 14 opposite to the first terminal 13. The second terminal 15 is located so that an end portion of an area of the second terminal 15 not covered with the first case 11 (not covered with the side wall portion of the concave portion 11b of the first case 11) will be situated inside the first case 11 from the notch 14a of the first insulating paper 14 and the connecting area 13a of the first terminal 13 exposed therefrom.

As illustrated in FIG. 2B, on a cross section taken in a direction D2 along a line passing through the notch 14a of the first insulating paper 14, the first terminal 13, the first insulating paper 14, and the second terminal 15 are located so as to form the shape of a staircase. As illustrated in FIG. 2C, on a cross section taken in the direction D2 along a line not passing through the notch 14a of the first insulating paper 14, the first insulating paper 14 and the second terminal 15 are located so as to form the shape of a staircase.

As illustrated in FIG. 2A, a third width W3 in a direction D1 along the first edge portion 11a of the first case 11 of the area of the first terminal 13 of the terminal structure portion 12 not covered with the first case 11 (not covered with the side wall portion of the concave portion 11b of the first case 11), that is to say, in this example a third width W3 of the end portion extending from the first case 11 is set to a determined value. For example, the third width W3 of the first terminal 13 is set so that it will become larger than a fifth width W5 of the third terminal 23 of the capacitor 20 (FIG. 3A) connected to the first terminal 13 as described later or a sixth width W6 of an intermediate portion 33 (FIG. 6A) opposite the first terminal 13 of the connecting member 30 connected to the second terminal 15.

The first insulating paper 14 covers the first terminal 13 in a state in which the connecting area 13a is situated under the notch 14a. As illustrated in FIG. 2A, a first width W1 in the direction D1 along the first edge portion 11a of the first case 11 of the area of the first insulating paper 14 not covered with the first case 11 (not covered with the side wall portion of the concave portion 11b of the first case 11), that is to say, in this example a first width W1 of the end portion extending from the first case 11 is set so that it will become larger than the third width W3 of the first terminal 13. As illustrated in FIG. 2A, the first width W1 of the end portion of the first insulating paper 14 extending from the first case 11 is set so that it will become larger than a width in the direction D1 along the first edge portion 11a of the concave portion 11b of the first case 11 (width between side wall portions of the concave portion 11b opposite each other).

As illustrated in FIG. 2A, a second width W2 in the direction D1 along the first edge portion 11a of the first case 11 of the notch 14a of the first insulating paper 14 is smaller than the first width W1 of the end portion of the first insulating paper 14 extending from the first case 11. The notch 14a having the second width W2 smaller than the first width W1 of the end portion of the first insulating paper 14 extending from the first case 11 is formed in the first insulating paper 14. As a result, the notch 14a has the shape of the letter "U" in plan view. As illustrated in FIG. 2A, the third width W3 of the first terminal 13 is set so that it will become smaller than the first width W1 of the first insulating paper 14 and so that it will become larger than the second width W2 of the notch 14a. The first terminal 13 is covered with the first insulating paper 14 except the connecting area 13a which is situated under the notch 14a of the first insulating paper 14.

As illustrated in FIG. 2A, a fourth width W4 of a portion of the first insulating paper 14 not extending from the first case 11, that is to say, a fourth width W4 of a portion superimposed in plan view over the first case 11 is set so that it will become smaller than the first width W1. The first insulating paper 14 has the following shape in this way. The first width W1 of the end portion of the first insulating paper 14 extending from the first case 11 is larger than the fourth width W4 of the portion of the first insulating paper 14 not extending from the first case 11. For example, the fourth width W4 is set so that it will be equal or approximately equal to the width in the direction D1 of the concave portion 11b of the first case 11 or the third width W3 of the end portion of the first terminal 13 extending from the first case 11.

The terminal structure portion 22 of the capacitor 20 will now be described with reference to FIGS. 3A and 3B.

Figure 3A:
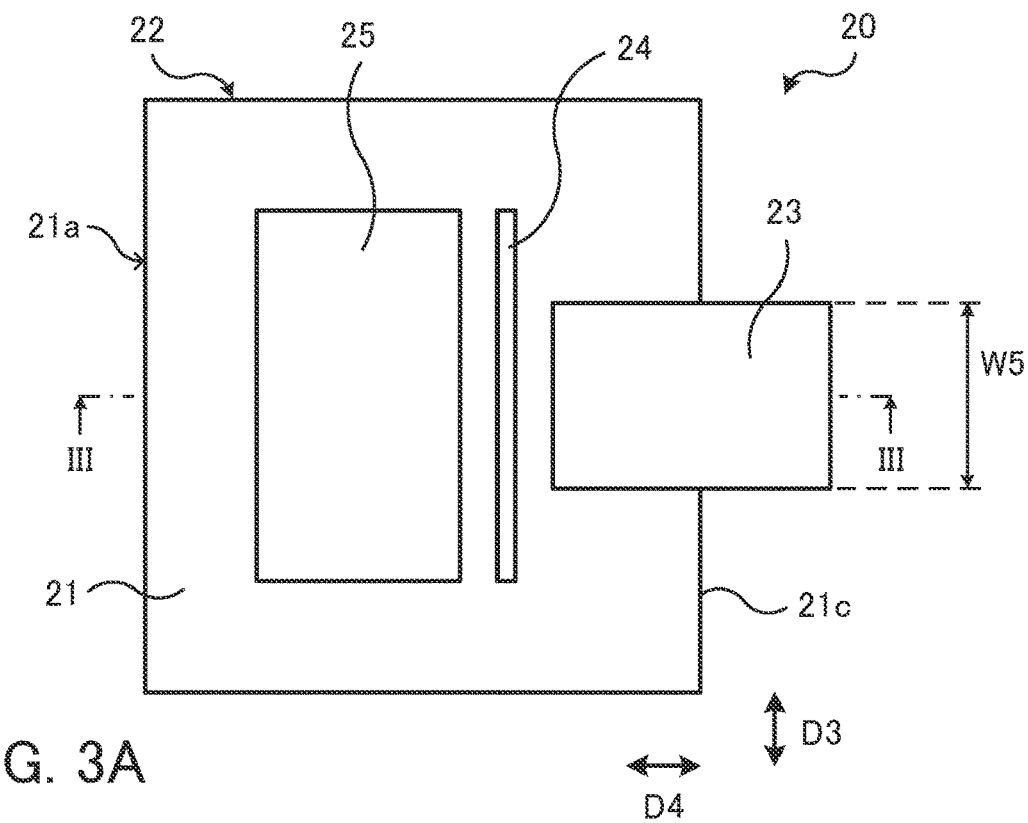
FIGS. 3A and 3B are views for describing an example of a terminal structure portion of a capacitor in the first embodiment.
Figure 3B:
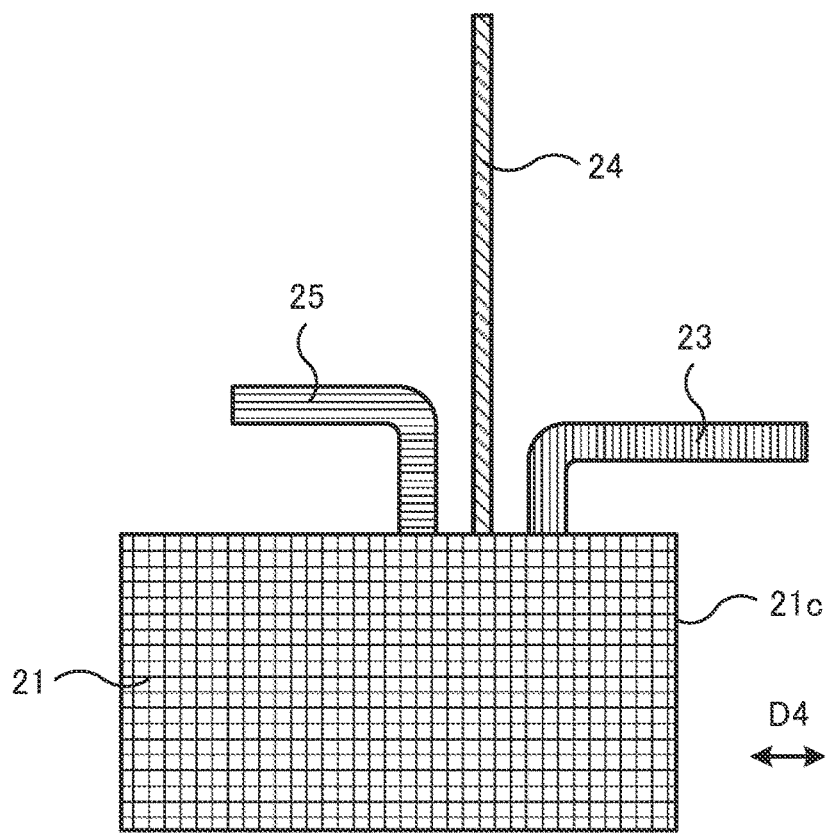

FIGS. 3A and 3B are views for describing an example of the terminal structure portion of the capacitor in the first embodiment. FIG. 3A is a fragmentary schematic plan view of an example of the terminal structure portion of the capacitor. FIG. 3B is a schematic sectional view taken along the line of FIG. 3A.

FIGS. 3A and 3B schematically illustrate an example of the terminal structure portion 22 of the capacitor 20 in the P portion illustrated in FIG. 1 and schematically illustrate an example of the terminal structure portion 22 of the capacitor 20 before connection to the semiconductor module 10.

As illustrated in FIGS. 3A and 3B, the terminal structure portion 22 of the capacitor 20 is located on the second edge portion 21a of the second case 21 of the capacitor 20. The terminal structure portion 22 of the capacitor 20 includes the third terminal 23, a second insulating paper 24, and a fourth terminal 25. For example, the third terminal 23 is an N terminal of the capacitor 20 and the fourth terminal 25 is a P terminal of the capacitor 20. The third terminal 23 and the fourth terminal 25 are made of metal such as copper or aluminum. The second insulating paper 24 is made of a material such as PA resin, fluoroplastic, or polyimide resin.

As illustrated in FIGS. 3A and 3B, the third terminal 23 is located on the side of a side face (second side face) 21c of the second edge portion 21a of the second case 21 of the capacitor 20 opposite the first edge portion 11a of the first case 11 of the semiconductor module 10. As illustrated in FIG. 3B, for example, one end of the third terminal 23 is connected to the second edge portion 21a of the second case 21 and the other end of the third terminal 23 is bent toward the outside of the second case 21.

As illustrated in FIGS. 3A and 3B, the fourth terminal 25 is located on the second edge portion 21a of the second case 21 inside the second case 21 from the third terminal 23, that is to say, inside the second case 21 in a direction D4. As illustrated in FIG. 3B, for example, one end of the fourth terminal 25 is connected to the second edge portion 21a of the second case 21 and the other end of the fourth terminal 25 is bent toward the inside of the second case 21.

As illustrated in FIGS. 3A and 3B, one end of the second insulating paper 24 is connected to the second edge portion 21a of the second case 21 between the third terminal 23 and the fourth terminal 25. The second insulating paper 24 has the flexibility to be bent to the side of the third terminal 23. The size of the second insulating paper 24 is such that it may cover the third terminal 23 when bent to the side of the third terminal 23. When the capacitor 20 is connected to the semiconductor module 10 as described later, the size of the second insulating paper 24 is such that it is bent and enters the concave portion 11b of the first case 11 of the semiconductor module 10, such that it does not cover the second terminal 15 of the semiconductor module 10, and such that it covers a portion at which the third terminal 23 of the capacitor 20 and the first terminal 13 of the semiconductor module 10 are connected.

As illustrated in FIG. 3A, a fifth width W5 of the third terminal 23 of the terminal structure portion 22 in a direction D3 along the second edge portion 21a of the second case 21, that is to say, in this example a fifth width W5 of an end portion of the third terminal 23 extending from the second case 21 is set to a determined value. As described later, the third terminal 23 is connected to the connecting area 13a of the first terminal 13 which is situated under the notch 14a of the first insulating paper 14 of the semiconductor module 10. The fifth width W5 of the third terminal 23 of the capacitor 20 is set so that it will become smaller than the third width W3 of the first terminal 13 of the semiconductor module 10. For example, the fifth width W5 of the third terminal 23 of the capacitor 20 is set so that it will be equal or approximately equal to a width of the connecting area 13a of the first terminal 13 of the semiconductor module 10 to which the third terminal 23 of the capacitor 20 is connected, that is to say, the second width W2 of the notch 14a of the first insulating paper 14 under which the connecting area 13a is situated or so that it will be smaller than the second width W2.

A process for connecting the semiconductor module 10 having the above terminal structure portion 12 and the capacitor 20 having the terminal structure portion 22 will now be described.

Figure 4A:
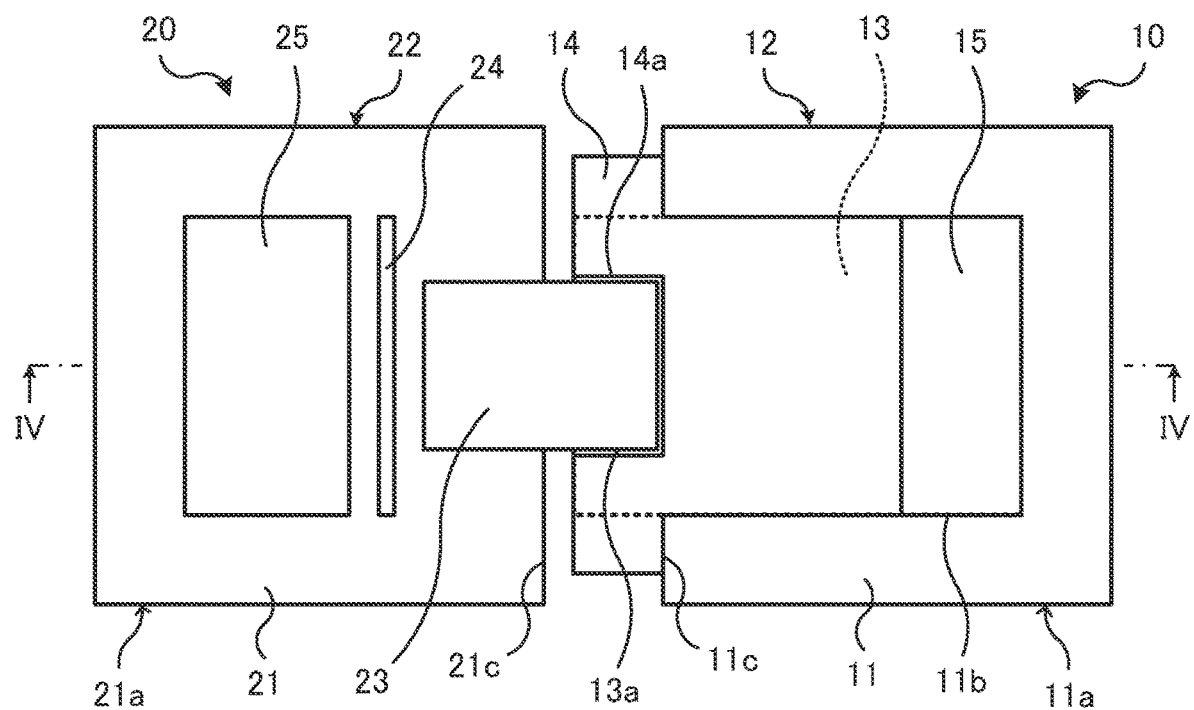
FIGS. 4A and 4B are views for describing an example of a process for connecting a semiconductor module and a capacitor in the first embodiment (part 1)
Figure 4B:
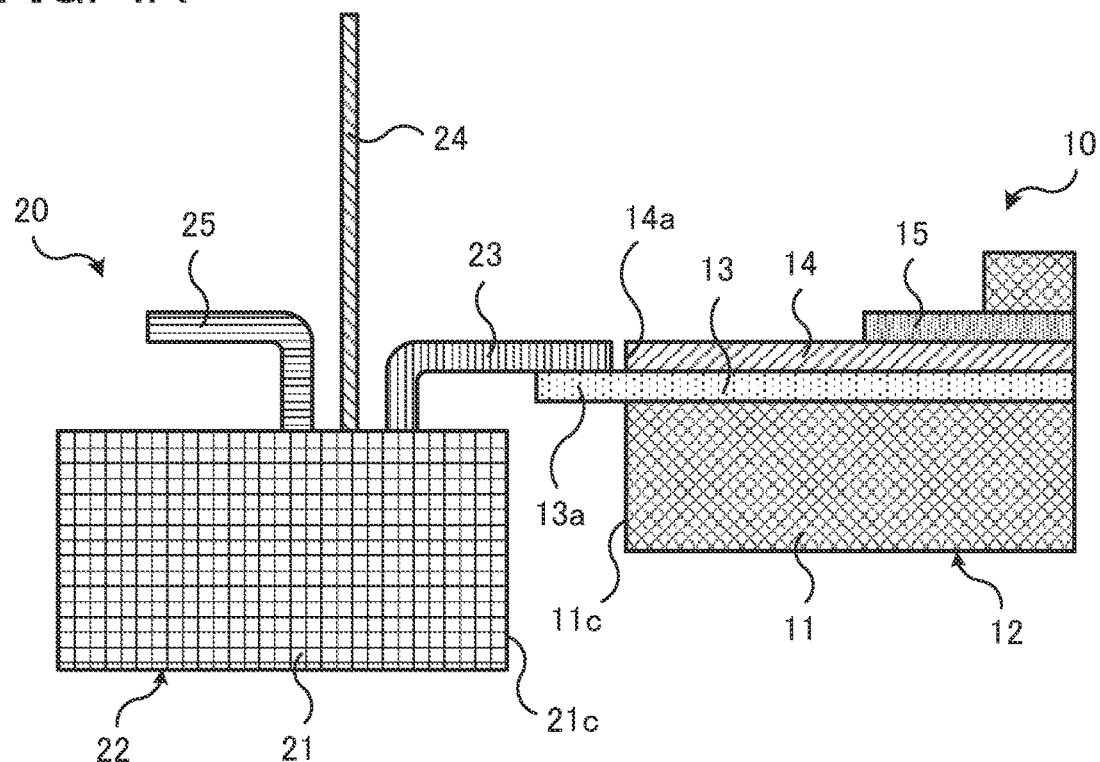
Figure 5A:
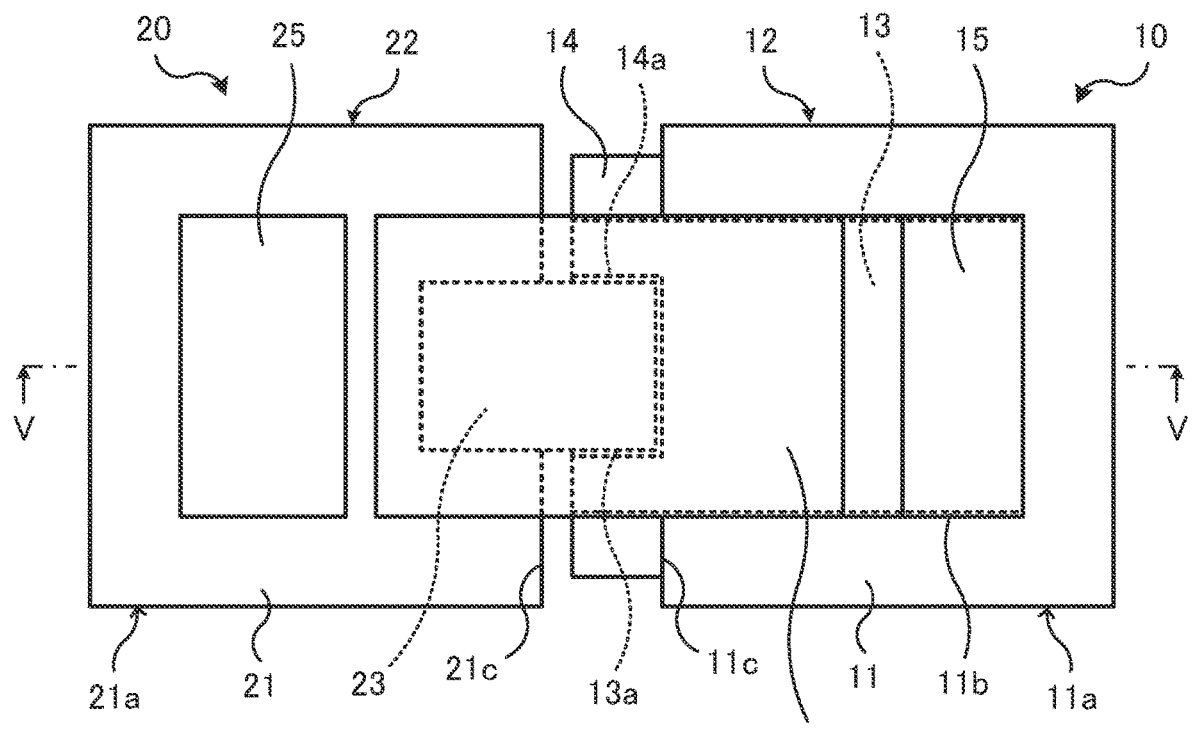
FIGS. 5A and 5B are views for describing an example of a process for connecting a semiconductor module and a capacitor in the first embodiment (part 2)
Figure 5B:
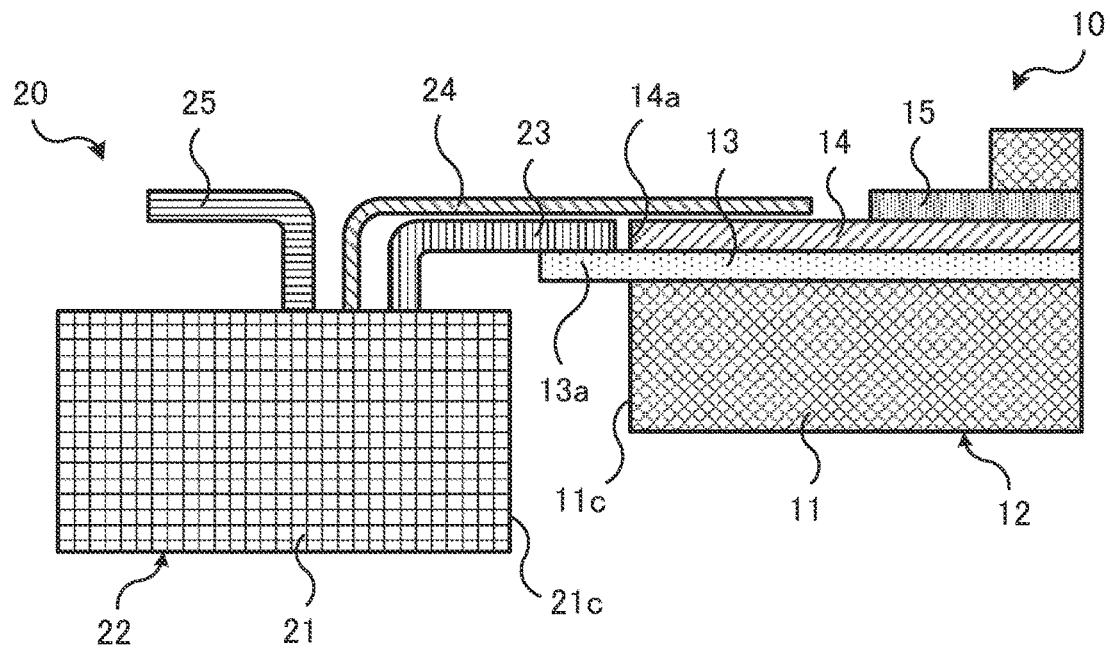
Figure 6A:
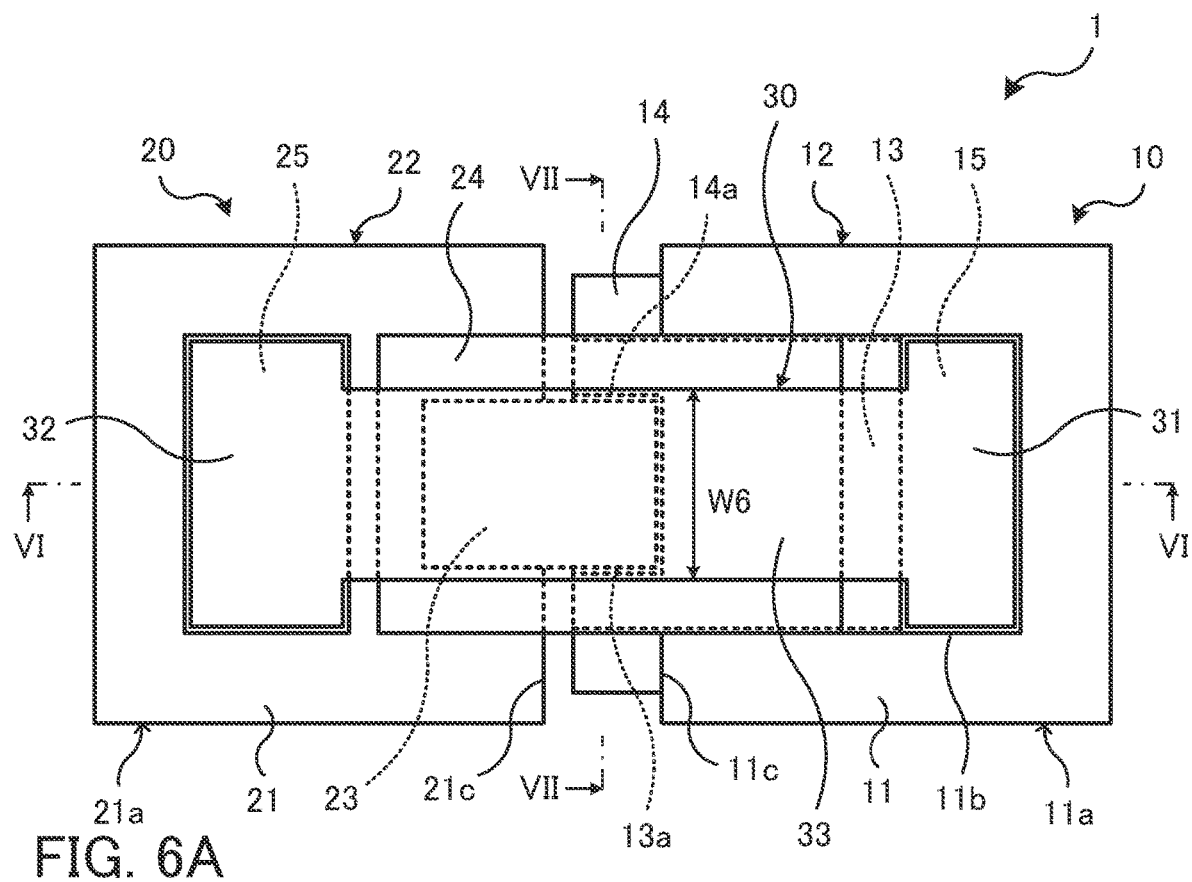
FIGS. 6A and 6B are views for describing an example of a process for connecting a semiconductor module and a capacitor in the first embodiment (part 3)
Figure 6B:
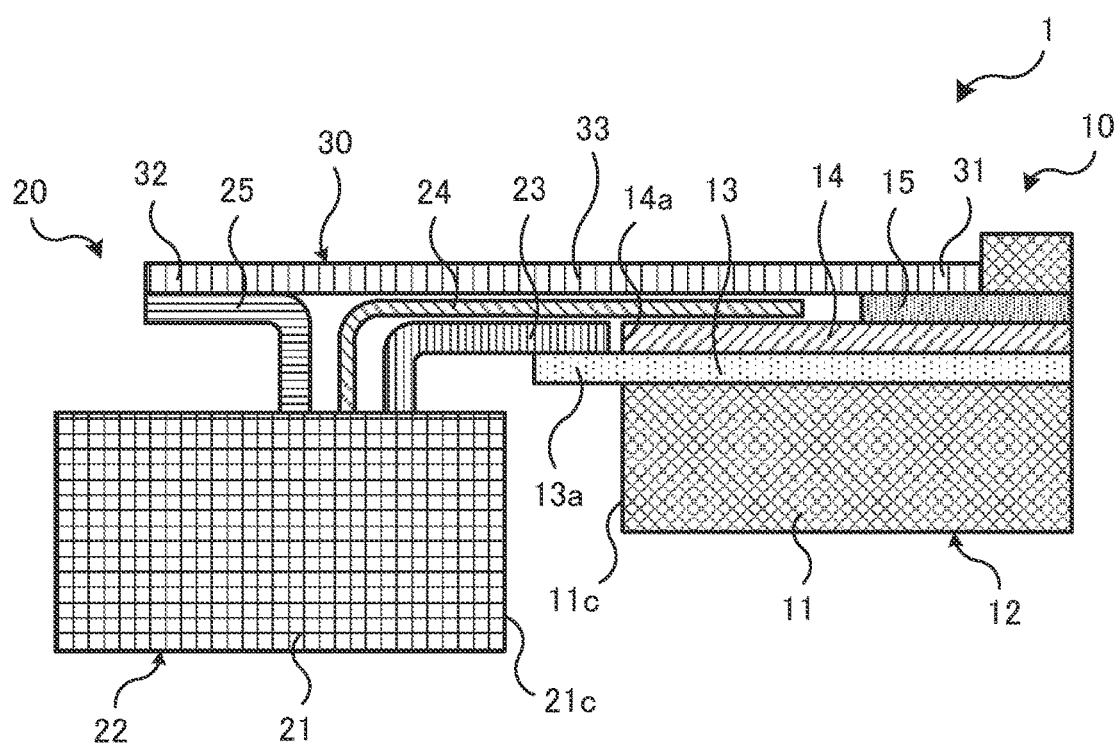

FIGS. 4 through 6 are views for describing an example of a process for connecting the semiconductor module and the capacitor in the first embodiment. FIG. 4A is a fragmentary schematic plan view of an example of a process for connecting the first terminal. FIG. 4B is a schematic sectional view taken along the line IV-IV of FIG. 4A. FIG. 5A is a fragmentary schematic plan view of an example of a process for coating an insulating paper. FIG. 5B is a schematic sectional view taken along the line V-V of FIG. 5A. FIG. 6A is a fragmentary schematic plan view of an example of a process for connecting the second terminal. FIG. 6B is a schematic sectional view taken along the line VI-VI of FIG. 6A.

As illustrated in FIGS. 4A and 4B, first, the semiconductor module 10 and the capacitor 20 are arranged so that (side face 11c of) the first edge portion 11a of the first case 11 of the semiconductor module 10 and (side face 21c of) the second edge portion 21a of the second case 21 will be opposed to each other. Then, the connecting area 13a of the first terminal 13 exposed from the notch 14a of the first insulating paper 14 in the terminal structure portion 12 located on the first edge portion 11a of the first case 11 of the semiconductor module 10 and the third terminal 23 of the terminal structure portion 22 located on the second edge portion 21a of the second case 21 of the capacitor 20 are connected. For example, each of the first terminal 13 of the semiconductor module 10 and the third terminal 23 of the capacitor 20 is an N terminal.

The first terminal 13 of the semiconductor module 10 and the third terminal 23 of the capacitor 20 are connected by, for example, laser welding. Laser welding may be performed by the use of a seam laser which continuously emits laser beams or a spot laser which emits pulsed laser beams. The first terminal 13 of the semiconductor module 10 and the third terminal 23 of the capacitor 20 may be connected by the use of another method such as solder bonding or ultrasonic bonding.

As illustrated in FIGS. 5A and 5B, after the first terminal 13 of the semiconductor module 10 and the third terminal 23 of the capacitor 20 are connected, the second insulating paper 24 of the capacitor 20 is bent to the side of a portion at which the first terminal 13 and the third terminal 23 are connected. By bending the second insulating paper 24 of the capacitor 20 in this way, the third terminal 23, the connecting area 13a of the first terminal 13 connected to the third terminal 23, and the first insulating paper 14 which covers the first terminal 13 so that the connecting area 13a will be situated under the notch 14a are covered with the second insulating paper 24 bent. The size of the second insulating paper 24 is set in the following way. When the second insulating paper 24 is bent, it enters the concave portion 11b of the first case 11 of the semiconductor module 10. Furthermore, an end of the second insulating paper 24 (on the opposite side of the one end connected to the second edge portion 21a of the second case 21) does not reach the second terminal 15 of the semiconductor module 10. That is to say, the end of the second insulating paper 24 is situated between the notch 14a of the first insulating paper 14 and the second terminal 15 of the semiconductor module 10.

For convenience, FIG. 5B illustrates a state in which the second insulating paper 24 bent is not in contact with the third terminal 23 of the capacitor 20 or the first insulating paper 14 of the semiconductor module 10. However, the second insulating paper 24 bent may be in contact with the third terminal 23 of the capacitor 20 and the first insulating paper 14 of the semiconductor module 10.

As illustrated in FIGS. 6A and 6B, after the second insulating paper 24 of the capacitor 20 is bent, the second terminal 15 of the semiconductor module 10 and the fourth terminal 25 of the capacitor 20 are connected by the use of the connecting member 30. The connecting member 30 is made of metal such as copper or aluminum. For example, a bus bar is used as the connecting member 30. The connecting member 30 is arranged so as to extend across the portion at which the first terminal 13 of the semiconductor module 10 and the third terminal 23 of the capacitor 20 are connected and the second insulating paper 24 of the capacitor 20 located so as to cover the first insulating paper 14 of the semiconductor module 10, and is connected to the second terminal 15 of the semiconductor module 10 and the fourth terminal 25 of the capacitor 20. For example, each of the second terminal 15 of the semiconductor module 10 and the fourth terminal 25 of the capacitor 20 is a P terminal and the connecting member 30 is a P-terminal connecting member (also referred to as a "P terminal") which connects P terminals of the semiconductor module 10 and the capacitor 20.

For convenience, FIG. 6B illustrates a state in which the connecting member 30 is not in contact with the second insulating paper 24 bent. However, the connecting member 30 may be in contact with the second insulating paper 24 bent.

The second terminal 15 of the semiconductor module 10 and the fourth terminal 25 of the capacitor 20 and the connecting member 30 are connected by, for example, laser welding. Laser welding may be performed by the use of a seam laser or a spot laser. The second terminal 15 of the semiconductor module 10 and the fourth terminal 25 of the capacitor 20 and the connecting member 30 may be connected by the use of another method such as solder bonding or ultrasonic bonding.

As illustrated in FIG. 6A, for example, the connecting member 30 has the shape of the letter "H" or a constricted shape in plan view. That is to say, the width of an end portion 31 of the connecting member 30 connected to the second terminal 15 of the semiconductor module 10 and the width of an end portion 32 of the connecting member 30 connected to the fourth terminal 25 of the capacitor 20 is larger in plan view than the width of the intermediate portion 33 between the end portion 31 and the end portion 32.

The intermediate portion 33 of the connecting member 30 is opposed to the first terminal 13 of the semiconductor module 10. The sixth width W6 of the intermediate portion 33 of the connecting member 30, that is to say, the sixth width W6 of the intermediate portion 33 opposite the first terminal 13 of the semiconductor module 10 is set so as to be smaller than the third width W3 of the first terminal 13 (FIG. 2A). For example, the sixth width W6 of the intermediate portion 33 of the connecting member 30 is set so that it will be equal or approximately equal or close to the second width W2 of the notch 14a of the first insulating paper 14 of the semiconductor module 10 (FIG. 2A) or the fifth width W5 of the third terminal 23 of the capacitor 20 (FIG. 3A) connected to the connecting area 13a of the first terminal 13 which is situated under the notch 14a.

By adopting the method illustrated in FIGS. 4 through 6, for example, the semiconductor device 1 including the semiconductor module 10 and the capacitor 20 connected to each other is obtained.

With power semiconductor devices used for power control or the like, usually high-speed switching is demanded in order to reduce switching loss which occurs at operation time. With power semiconductor devices, a surge voltage is added to the direct-current voltage of a power source when a semiconductor element is turned off. A surge voltage (ΔV) is given by $$\Delta V = L \times di/dt$$

where L is wiring inductance and di/dt is a time change rate of a current. If a surge voltage higher than the breakdown voltage of the semiconductor element is applied, then the performance of the semiconductor element may deteriorate or the semiconductor element may break down. Therefore, when power semiconductor devices are driven on the basis of high-speed switching, then it is desirable to reduce wiring inductance as much as possible.

With the above semiconductor device 1, the first terminal 13 and the third terminal 23, which are N terminals, and the P-terminal connecting member 30 connected to the second terminal 15 and the fourth terminal 25, which are P terminals, are arranged with the first insulating paper 14 and the second insulating paper 24 therebetween. With the semiconductor device 1, the P terminals are arranged in proximity to the N terminals so that currents will flow in opposite directions. Inductance is reduced by mutual inductance.

A portion at which the semiconductor module 10 and the capacitor 20 are connected in the semiconductor device 1 obtained in the above way will be described further.

Figure 7:
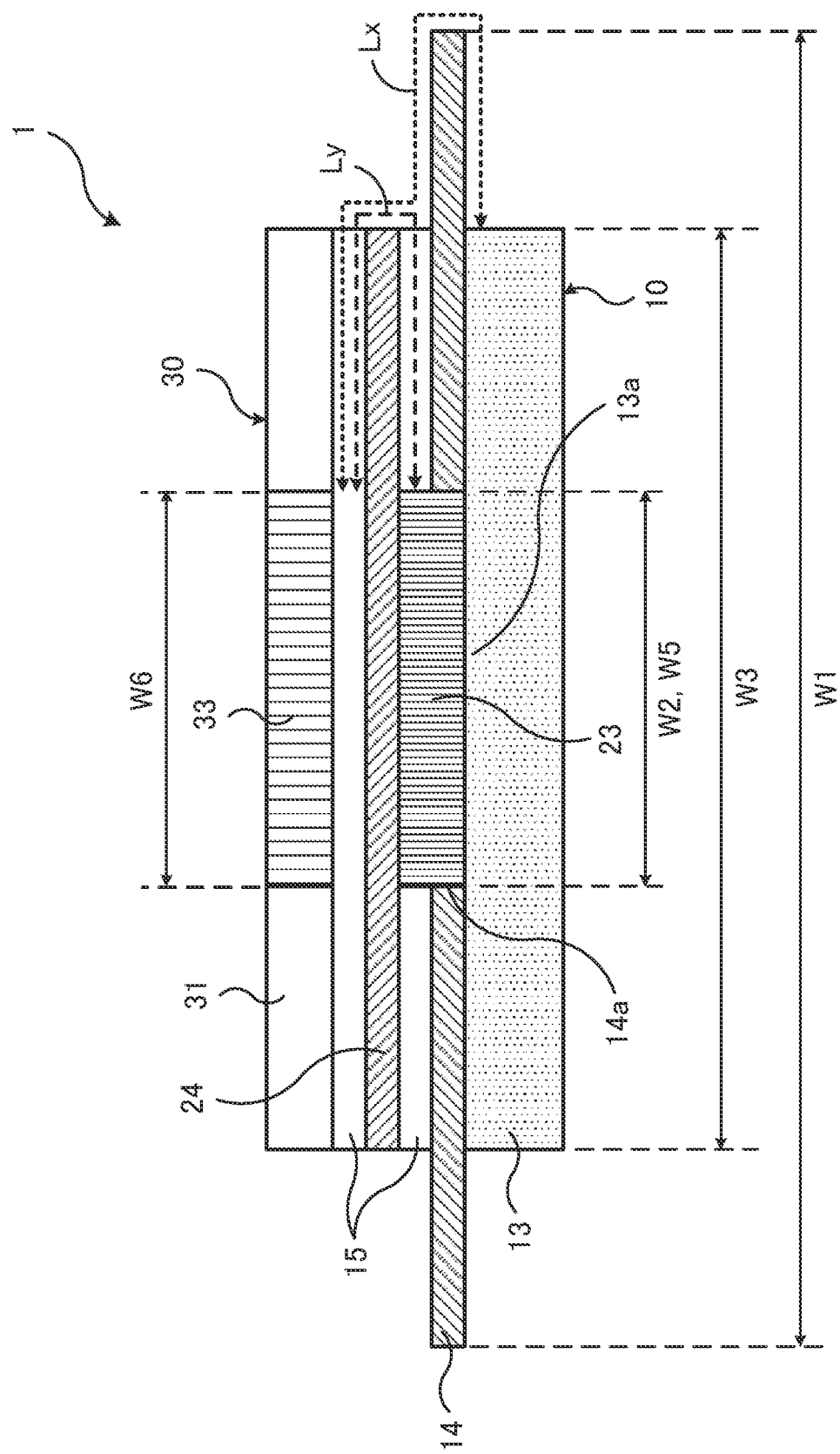
FIG. 7 is a view for describing an example of a portion at which a semiconductor module and a capacitor in the first embodiment are connected.

FIG. 7 is a view for describing an example of a portion at which the semiconductor module and the capacitor in the first embodiment are connected. FIG. 7 is a schematic sectional view taken along the line VII-VII of FIG. 6A.

For example, a portion of the semiconductor device 1 at which the semiconductor module 10 and the capacitor 20 are connected has a structure illustrated in FIG. 7. That is to say, in the semiconductor module 10 the first insulating paper 14 with the first width W1 including the notch 14a with the second width W2 is located on the first terminal 13 (N terminal) with the third width W3. The third terminal 23 (N terminal) with the fifth width W5 of the capacitor 20 is connected to the connecting area 13a of the first terminal 13 which is situated under the notch 14a of the first insulating paper 14. The second insulating paper 24 of the capacitor 20 is located so as to cover the portion at which the connecting area 13a of the first terminal 13 of the semiconductor module 10 and the third terminal 23 of the capacitor 20 are connected and the first insulating paper 14. The second terminal 15 (P terminal) of the semiconductor module 10 and the fourth terminal 25 (P terminal) (not illustrated) of the capacitor 20 are connected by the connecting member 30 (P terminal). With the connecting member 30 the intermediate portion 33 opposite the first terminal 13 and the third terminal 23 has the sixth width W6 smaller than the width of the end portion 31. The end portion 31 of the connecting member 30 is connected to the second terminal 15 of the semiconductor module 10 and the end portion 32 (not illustrated) of the connecting member 30 is connected to the fourth terminal 25 of the capacitor 20.

With the semiconductor device 1, the third width W3 of the first terminal 13 (N terminal) of the semiconductor module 10 connected to the third terminal 23 (N terminal) of the capacitor 20 is set so as to be larger than the sixth width W6 of the intermediate portion 33 of the connecting member 30 (P terminal) opposite the first terminal 13. Accordingly, the cross-sectional area of the first terminal 13 is large compared with a case where the third width W3 of the first terminal 13 is equal or approximately equal to the sixth width W6 of the intermediate portion 33 of the connecting member 30. The cross-sectional area of the first terminal 13, of the first terminal 13 and the intermediate portion 33 of the connecting member 30, increases. This reduces inductance at the portion the semiconductor module 10 and the capacitor 20 are connected. With the semiconductor device 1, inductance is reduced in this way. As a result, high-speed switching and a reduction in switching loss are realized.

With the semiconductor device 1, as stated above, the first terminal 13 having a width larger than that of the intermediate portion 33 of the connecting member 30 is covered with the first insulating paper 14 in a state in which the connecting area 13a is situated under the notch 14a. The width of the first insulating paper 14 is set to the first width W1 larger than the third width W3 of the first terminal 13. The third width W3 of the first terminal 13 is set so as to be smaller than the width of the first insulating paper 14 and larger than the width of the notch 14a. With the semiconductor device 1, as stated above, the first insulating paper 14 covers the first terminal 13 except the connecting area 13a and the width of the first insulating paper 14 is larger than that of the first terminal 13. As a result, even if the width of the first terminal 13 is made larger in the above way than that of the intermediate portion 33 of the connecting member 30 in order to reduce inductance, insulation distance (creepage distance) along the first insulating paper 14 and the second insulating paper 24 between the first terminal 13 and the third terminal 23 and the intermediate portion 33 of the connecting member 30, that is to say, insulation distances Lx and Ly along the first insulating paper 14 and the second insulating paper 24, respectively, between the N terminals and the P terminal indicated by dotted arrows in FIG. 7 are ensured.

A semiconductor device according to another embodiment including a semiconductor module and a capacitor will now be described for comparison.

Figure 8A:
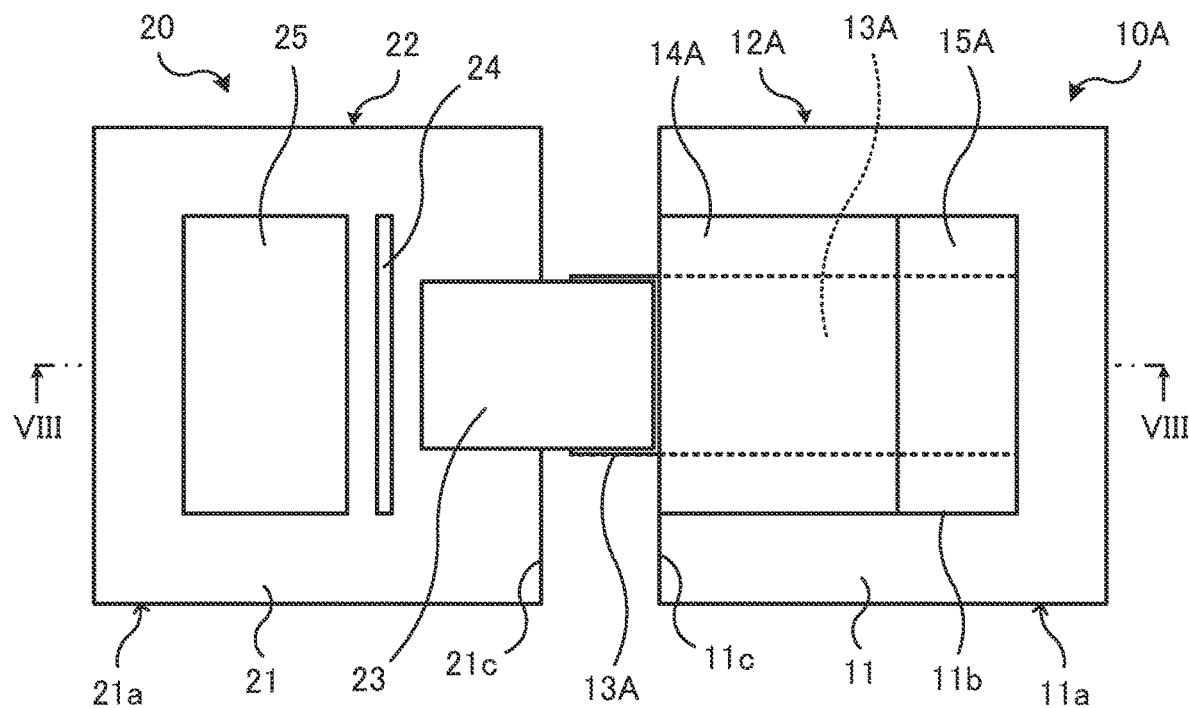
FIGS. 8A and 8B are views for describing an example of a process for connecting a semiconductor module and a capacitor in another embodiment (part 1)
Figure 8B:
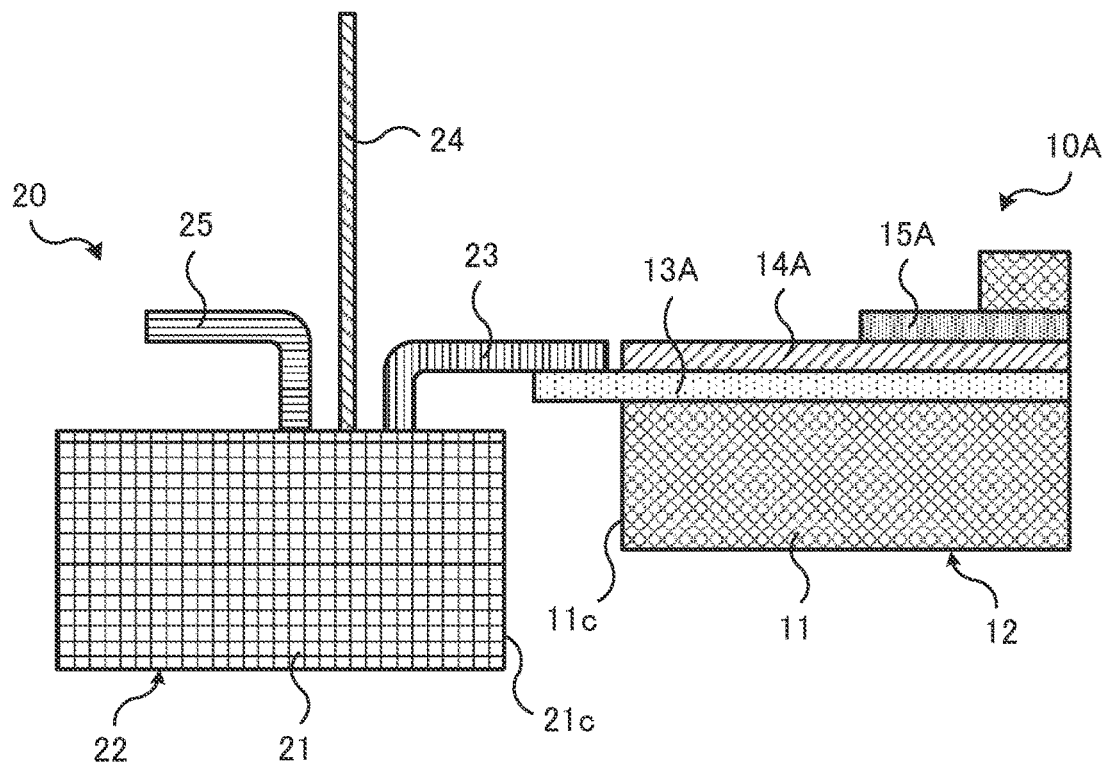
Figure 9A:
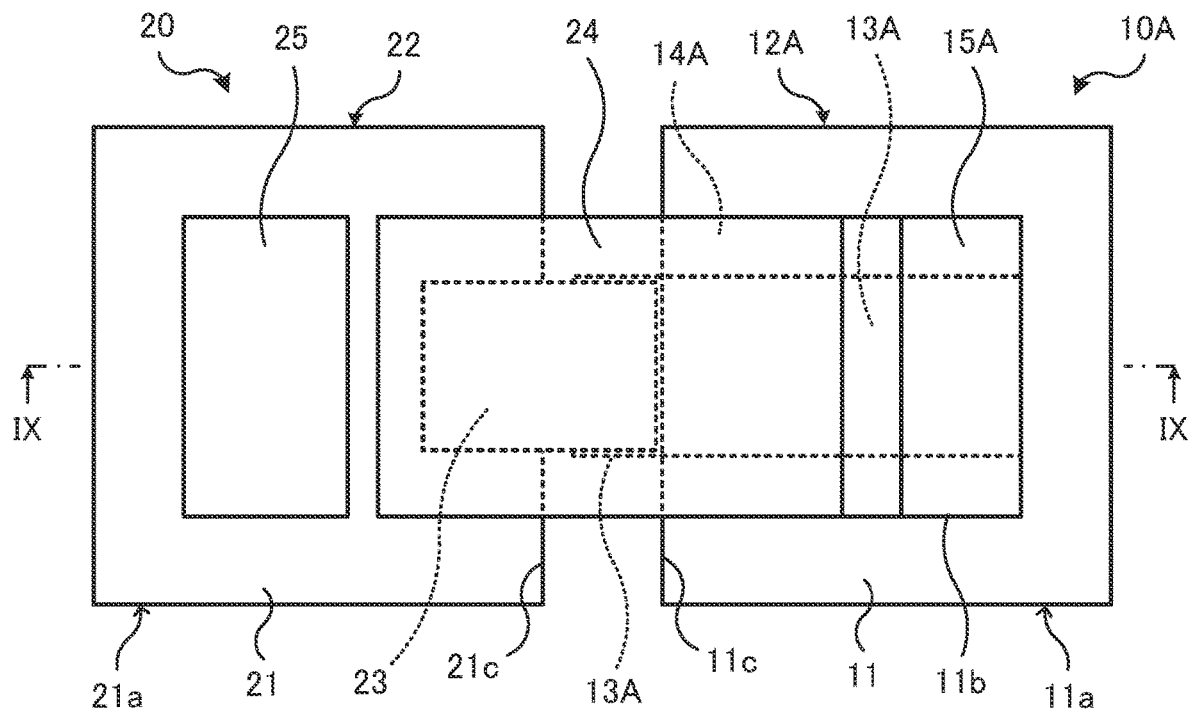
FIGS. 9A and 9B are views for describing an example of a process for connecting a semiconductor module and a capacitor in another embodiment (part 2)
Figure 9B:
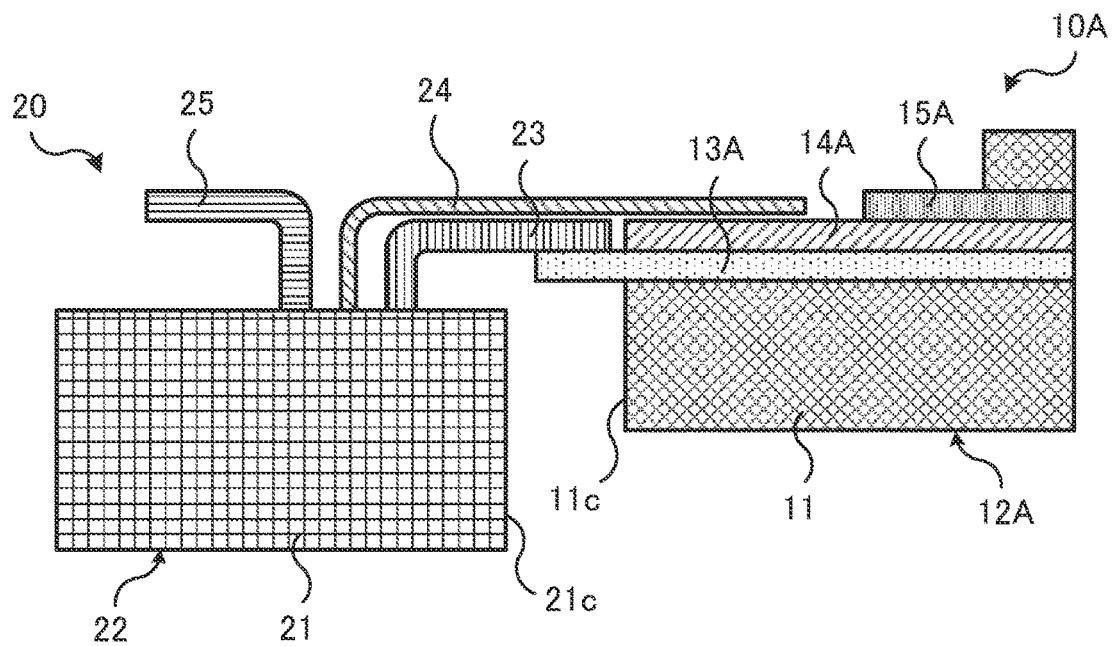
Figure 10A:
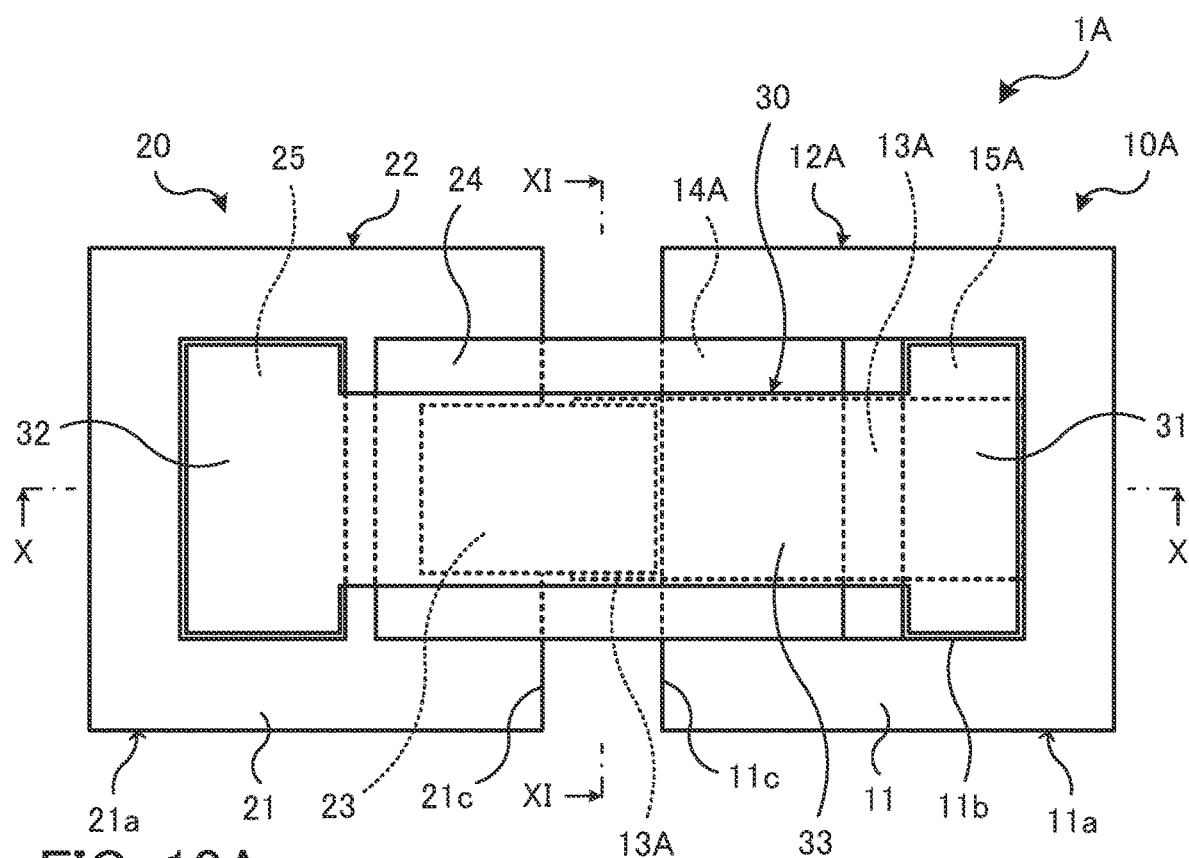
FIGS. 10A and 10B are views for describing an example of a process for connecting a semiconductor module and a capacitor in another embodiment (part 3)
Figure 10B:
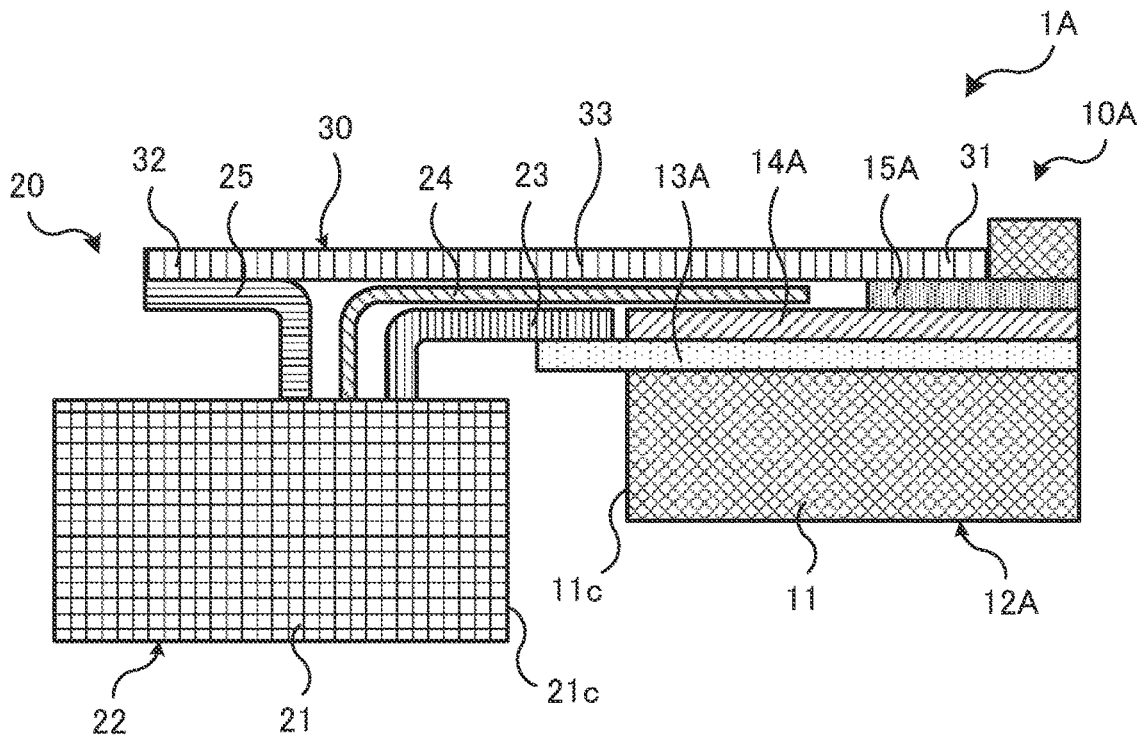

FIGS. 8 through 10 are views for describing an example of a process for connecting a semiconductor module and a capacitor in another embodiment. FIG. 8A is a fragmentary schematic plan view of an example of a process for connecting a first terminal. FIG. 8B is a schematic sectional view taken along the line VIII-VIII of FIG. 8A. FIG. 9A is a fragmentary schematic plan view of an example of a process for coating an insulating paper. FIG. 9B is a schematic sectional view taken along the line IX-IX of FIG. 9A. FIG. 10A is a fragmentary schematic plan view of an example of a process for connecting a second terminal. FIG. 10B is a schematic sectional view taken along the line X-X of FIG. 10A.

A semiconductor module 10A having a terminal structure portion 12A illustrated in FIGS. 8A and 8B is used. The terminal structure portion 12A of the semiconductor module 10A is located on a first edge portion 11a of a first case 11 in which a concave portion 11b is formed. The terminal structure portion 12A includes a first terminal 13A (N terminal) having a comparatively small width. For example, the terminal structure portion 12A includes a first terminal 13A having a width approximately equal to that of a third terminal 23 of a capacitor 20 connected to the semiconductor module 10A. An end portion of the first terminal 13A extends from the first case 11. The first terminal 13A is covered with a first insulating paper 14A except the end portion extending from the first case 11. The first insulating paper 14A is located in the concave portion 11b of the first case 11 and the size of the first insulating paper 14A is such that it does not extend from the concave portion 11b of the first case 11. A second terminal 15A (P terminal) is located on the first insulating paper 14A. The semiconductor module 10A differs from the semiconductor module 10 described in the above first embodiment in that it has the above terminal structure portion 12A.

For example, the semiconductor module 10A having the above terminal structure portion 12A and the capacitor 20 having a terminal structure portion 22 are connected in the following way.

As illustrated in FIGS. 8A and 8B, first, the semiconductor module 10A and the capacitor 20 are arranged so that (side face 11c of) the first edge portion 11a of the first case 11 and (side face 21c of) a second edge portion 21a of a second case 21 will be opposed to each other. Then, the first terminal 13A of the terminal structure portion 12A of the semiconductor module 10A extending from the first case 11 and the third terminal 23 (N terminal) of the terminal structure portion 22 of the capacitor 20 are connected by the use of a method such as laser welding.

As illustrated in FIGS. 9A and 9B, after the first terminal 13A of the semiconductor module 10A and the third terminal 23 of the capacitor 20 are connected, a second insulating paper 24 of the capacitor 20 is bent to the side of a portion at which the first terminal 13A and the third terminal 23 are connected. The third terminal 23, the first terminal 13A connected to the third terminal 23, and the first insulating paper 14A are covered with the second insulating paper 24 bent. For convenience, FIG. 9B illustrates a state in which the second insulating paper 24 bent is not in contact with the third terminal 23 of the capacitor 20 or the first insulating paper 14A of the semiconductor module 10A. However, the second insulating paper 24 bent may be in contact with the third terminal 23 of the capacitor 20 and the first insulating paper 14A of the semiconductor module 10A.

As illustrated in FIGS. 10A and 10B, after the second insulating paper 24 of the capacitor 20 is bent, the second terminal 15A of the semiconductor module 10A and a fourth terminal 25 of the capacitor 20 are connected by the use of a connecting member 30 (P terminal). The connecting member 30 is arranged so as to extend across the portion at which the first terminal 13A of the semiconductor module 10A and the third terminal 23 of the capacitor 20 are connected and the second insulating paper 24 of the capacitor 20 located so as to cover the first insulating paper 14A of the semiconductor module 10A, and is connected to the second terminal 15A of the semiconductor module 10 and the fourth terminal 25 of the capacitor 20 by the use of a method such as the laser welding. For convenience, FIG. 10B illustrates a state in which the connecting member 30 is not in contact with the second insulating paper 24 bent. However, the connecting member 30 may be in contact with the second insulating paper 24 bent.

By adopting the method illustrated in FIGS. 8 through 10, for example, the semiconductor device 1A including the semiconductor module 10A and the capacitor 20 connected to each other is obtained.

Figure 11:
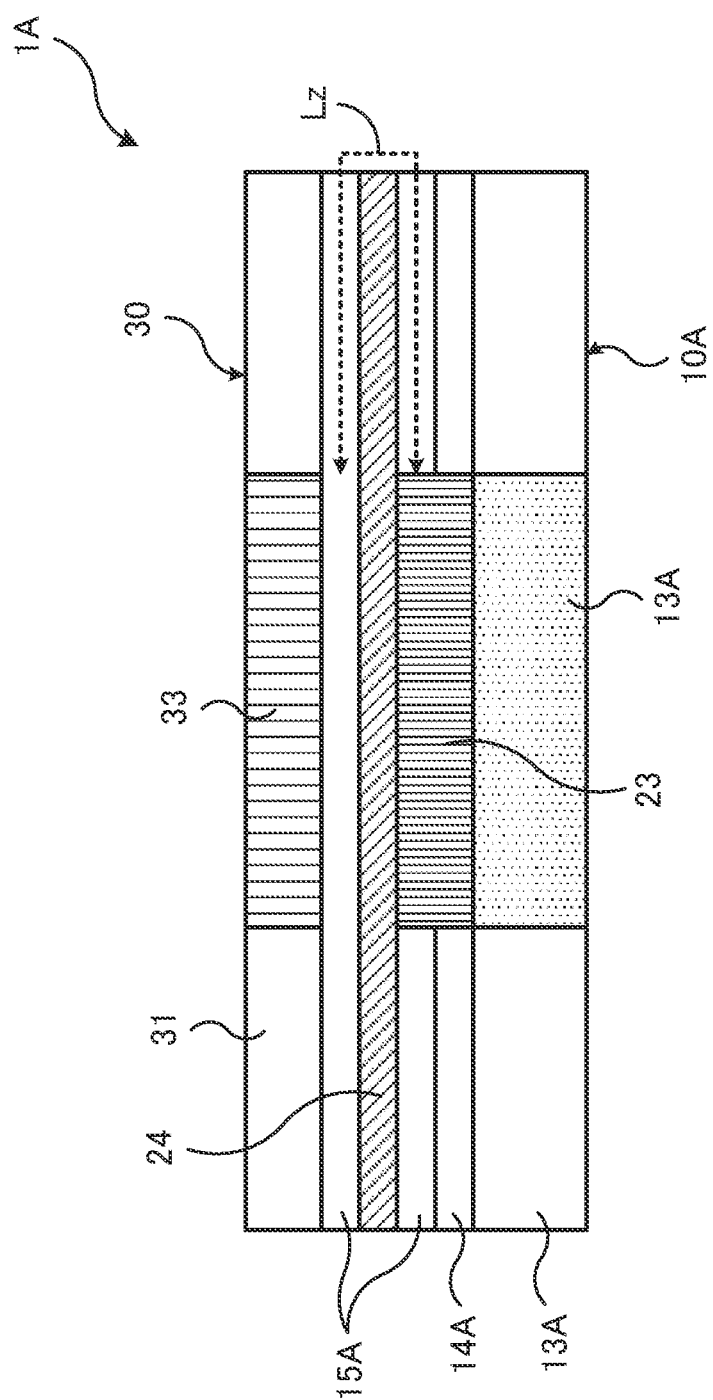
FIG. 11 is a view for describing an example of a portion at which a semiconductor module and a capacitor in another embodiment are connected.

FIG. 11 is a view for describing an example of a portion at which the semiconductor module and the capacitor in another embodiment are connected. FIG. 11 is a schematic sectional view taken along the line XI-XI of FIG. 10A.

For example, a portion of the semiconductor device 1A at which the semiconductor module 10A and the capacitor 20 are connected has a structure illustrated in FIG. 11. That is to say, the third terminal 23 (N terminal) of the capacitor 20 is connected to the first terminal 13A (N terminal) of the semiconductor module 10A. The second insulating paper 24 of the capacitor 20 is located so as to cover the third terminal 23 of the capacitor 20 and the first terminal 13A of the semiconductor module 10A. The second terminal 15A (P terminal) of the semiconductor module 10A and the fourth terminal 25 (P terminal) (not illustrated) of the capacitor 20 are connected by the connecting member 30 (P terminal) including an intermediate portion 33 opposite the first terminal 13A and the third terminal 23. An end portion 31 of the connecting member 30 is connected to the second terminal 15A of the semiconductor module 10A and an end portion 32 (not illustrated) of the connecting member 30 is connected to the fourth terminal 25 of the capacitor 20.

With the semiconductor device 1A, the width of the third terminal 23 (N terminal) of the capacitor 20 and the first terminal 13A (N terminal) of the semiconductor module 10A connected thereto is set so as to be equal or approximately equal to that of the intermediate portion 33 of the connecting member 30 (P terminal) opposite the third terminal 23 and the first terminal 13A. As a result, insulation distance (creepage distance) along the second insulating paper 24 between the first terminal 13A and the third terminal 23 and the intermediate portion 33 of the connecting member 30, that is to say, insulation distance Lz along the second insulating paper 24 between the N terminals and the P terminal indicated by a dotted arrow in FIG. 11 is ensured.

With the semiconductor device 1A, on the other hand, the width of the third terminal 23 and the first terminal 13A is set so as to be equal or approximately equal to that of the intermediate portion 33 of the connecting member 30. Accordingly, it may be that inductance at the portion at which the semiconductor module 10A and the capacitor 20 are connected will not be sufficiently reduced.

Figure 12A:
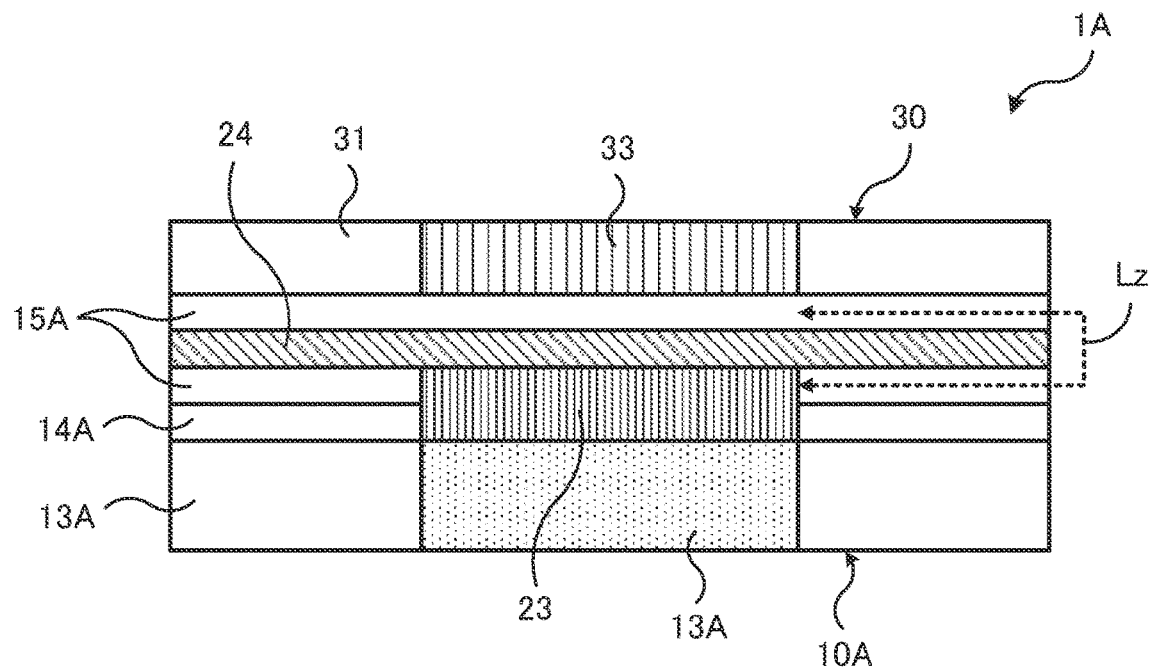
FIGS. 12A and 12B are views for describing the relationship between terminal width in a semiconductor module in another embodiment and insulation distance.
Figure 12B:
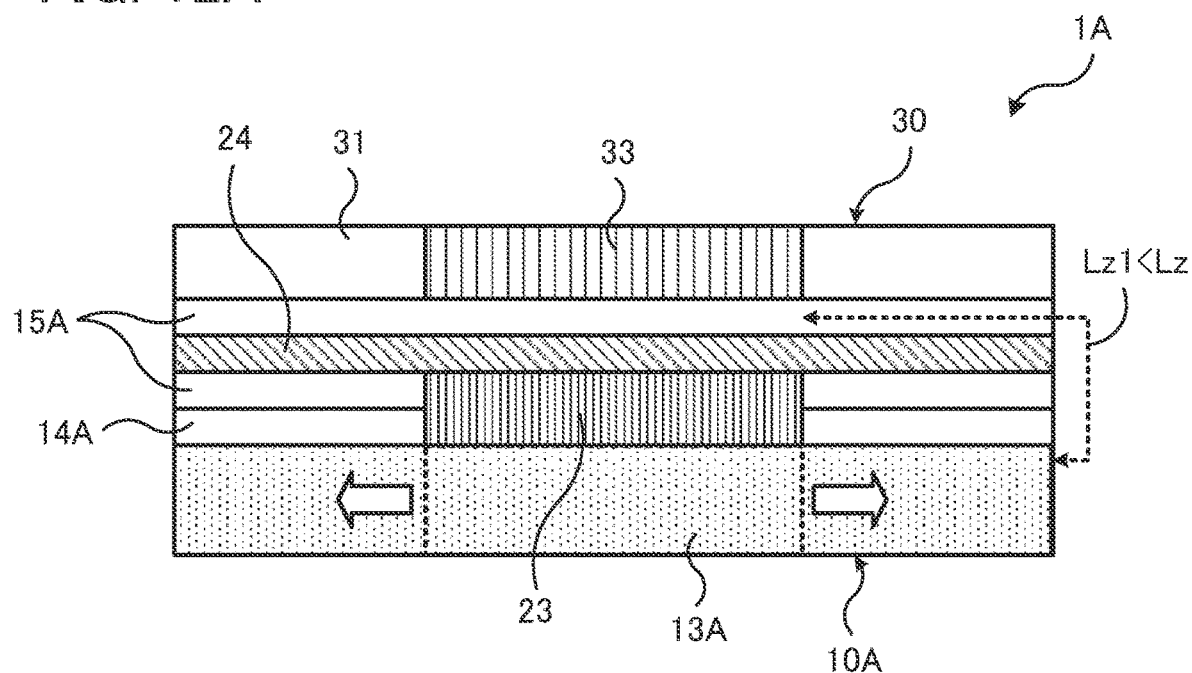

FIGS. 12A and 12B are views for describing the relationship between terminal width in the semiconductor module in another embodiment and insulation distance. FIGS. 12A and 12B are schematic sectional views of the portion at which the semiconductor module and the capacitor are connected.

As illustrated in FIG. 12A (and the above FIG. 11), with the semiconductor device 1A, the width of the third terminal 23 (N terminal) of the capacitor 20 and the first terminal 13A (N terminal) of the semiconductor module 10A connected thereto is set so as to be equal or approximately equal to that of the intermediate portion 33 of the connecting member 30 (P terminal) opposite the third terminal 23 and the first terminal 13A. As stated above, with the semiconductor device 1A, on the one hand, it may be that inductance at the portion at which the semiconductor module 10A and the capacitor 20 are connected will not be sufficiently reduced. However, on the other hand, the insulation distance Lz between the first terminal 13A and the third terminal 23 (N terminals) and the intermediate portion 33 of the connecting member 30 (P terminal) is ensured.

As illustrated in FIG. 12B, for example, the width of the first terminal 13A of the semiconductor module 10A may be expanded in order to reduce inductance at the portion of the semiconductor device 1A at which the semiconductor module 10A and the capacitor 20 are connected. On the one hand, inductance is reduced by expanding the width of the first terminal 13A in this way. However, on the other hand, insulation distance Lz1 along the second insulating paper 24 between the first terminal 13A and the intermediate portion 33 of the connecting member 30 becomes shorter than the insulation distance Lz along the second insulating paper 24 between the third terminal 23 and the intermediate portion 33 of the connecting member 30. As a result, it may be that a sufficient insulation distance will not be ensured between the N terminal and the P terminal.

As illustrated in FIG. 7 etc., with the semiconductor device 1 described in the above first embodiment (FIGS. 1 through 7), in order to reduce inductance at the portion at which the semiconductor module 10 and the capacitor 20 are connected, the first terminal 13 having a width larger than that of the intermediate portion 33 of the connecting member 30 is covered with the first insulating paper 14 in a state in which the connecting area 13a is situated under the notch 14a. The width of the first insulating paper 14 is still larger than that of the first terminal 13. The width of the first terminal 13 is smaller than that of the first insulating paper 14 and is larger than that of the notch 14a. With the semiconductor device 1, as stated above, the first insulating paper 14 covers the first terminal 13 except the connecting area 13a and the width of the first insulating paper 14 is larger than that of the first terminal 13. As a result, even if the width of the first terminal 13 is larger than that of the intermediate portion 33 of the connecting member 30 in order to reduce inductance, the insulation distances Lx and Ly along the first insulating paper 14 and the second insulating paper 24, respectively, between the first terminal 13 and the third terminal 23 (N terminals) and the intermediate portion 33 of the connecting member 30 (P terminal) are ensured.

The adoption of the semiconductor device 1 (FIGS. 1 through 7) makes it possible to reduce inductance while ensuring insulation distance. According to the semiconductor module 10 including the above first terminal 13 and first insulating paper 14, the semiconductor device 1 that reduces inductance while ensuring insulation distance at the portion at which the semiconductor module 10 and the capacitor 20 are connected is realized.

Results obtained by evaluating the relationship between terminal width and inductance for the above semiconductor device 1A (FIGS. 8 through 11) and the above semiconductor device 1 (FIGS. 1 through 7) as examples will be given.

With the semiconductor device 1A, it is assumed that the width of the first terminal 13A and the third terminal 23 of FIG. 11, which are N terminals, is 22.9 [mm]. It is assumed that the width of the intermediate portion 33 of the connecting member 30 of FIG. 11, which is a P terminal, is 22.9 [mm] and is equal to that of the first terminal 13A and the third terminal 23. Then inductance at the portion at which the semiconductor module 10A and the capacitor 20 are connected is 3.1 [nH] (excluding the inductance of internal circuits of the semiconductor device 1A).

With the semiconductor device 1, on the other hand, it is assumed that the width (W3) of the first terminal 13, of the first terminal 13 and the third terminal 23 of FIG. 7 which are N terminals, is expanded to 28 [mm], that the width (W2 and W5) of the third terminal 23 is not changed and is 22.9 [mm], and that the width (W6) of the intermediate portion 33 of the connecting member 30 of FIG. 7, which is a P terminal, is not changed either and is 22.9 [mm]. Then inductance at the portion at which the semiconductor module 10 and the capacitor 20 are connected is reduced to 2.9 [nH] (excluding the inductance of internal circuits of the semiconductor device 1).

With the semiconductor device 1, inductance is reduced by expanding the width of the first terminal 13 of the semiconductor module 10. With the semiconductor device 1, as stated above, the first terminal 13 having an expanded width is covered with the first insulating paper 14 having a width still larger than that of the first terminal 13 in a state in which the connecting area 13a is situated under the notch 14a. As a result, the insulation distances Lx and Ly between the first terminal 13 and the third terminal 23 (N terminals) and the intermediate portion 33 of the connecting member 30 (P terminal) are ensured.

The adoption of the semiconductor device 1 makes it possible to reduce inductance while ensuring insulation distance. According to the semiconductor module 10 including the above first terminal 13 and first insulating paper 14, the semiconductor device 1 that reduces inductance while ensuring insulation distance at the portion at which the semiconductor module 10 and the capacitor 20 are connected is realized.

With the semiconductor device 1, the connecting member 30 used for connecting the second terminal 15 of the semiconductor module 10 and the fourth terminal 25 of the capacitor 20 includes the intermediate portion 33 having a width smaller than that of the end portions 31 and 32. The use of the connecting member 30 including the intermediate portion 33 having a width smaller than that of the end portions 31 and 32 makes it possible to increase insulation distances between the intermediate portion 33 and the first terminal 13 of the semiconductor module 10 and the third terminal 23 of the capacitor 20, compared with a case where the width of the intermediate portion 33 is not smaller than that of the end portions 31 and 32. Furthermore, the connecting member 30 is connected to the second terminal 15 and the fourth terminal 25 at the end portions 31 and 32, respectively, each having a width larger than that of the intermediate portion 33. From the viewpoint of ensuring insulation distance while ensuring terminal connection area, it is desirable to use the above connecting member 30 including the intermediate portion 33 having a width smaller than that of the end portions 31 and 32 as the connecting member 30 for connecting the second terminal 15 of the semiconductor module 10 and the fourth terminal 25 of the capacitor 20.

The first terminal 13 and the first insulating paper 14 of the semiconductor module 10 will be described further.

Figure 13A:
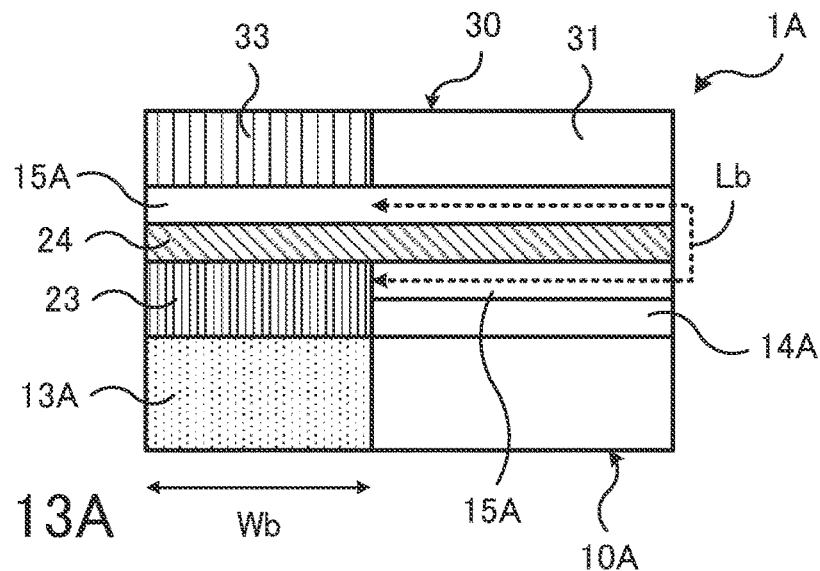
FIGS. 13A through 13C are views for describing the relationship between terminal width and insulation distance in the semiconductor module in the first embodiment.
Figure 13B:
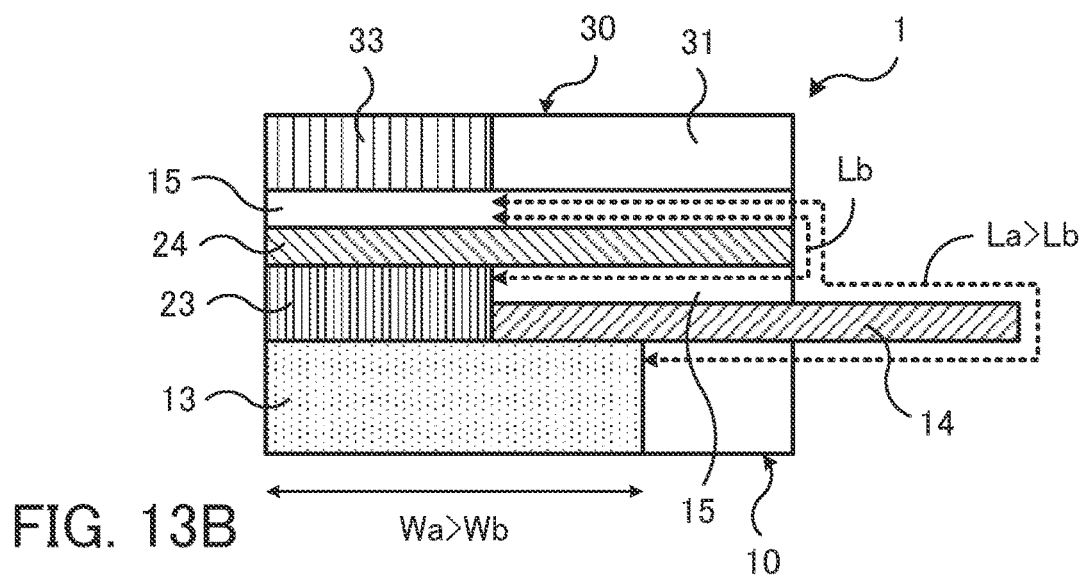
Figure 13C:
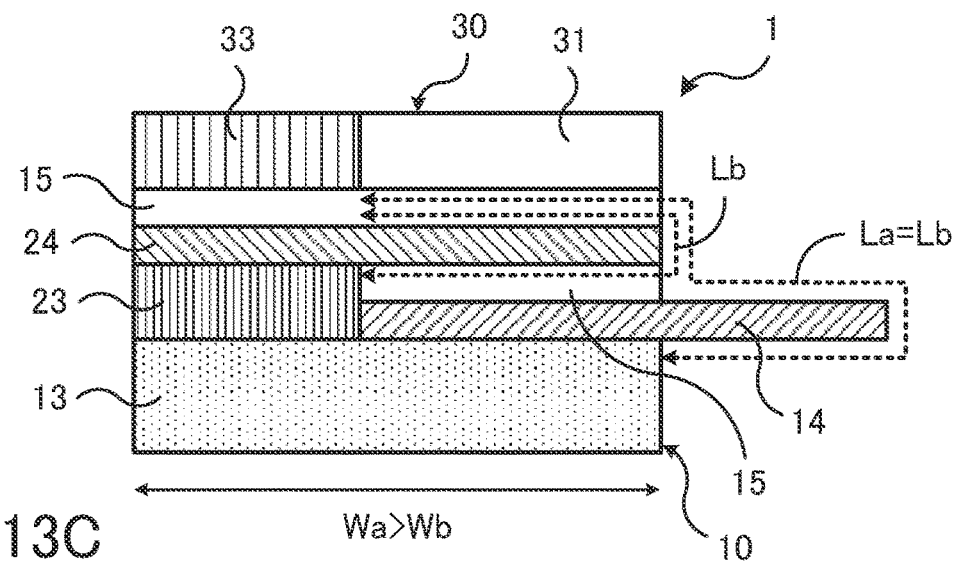

FIGS. 13A through 13C are views for describing the relationship between terminal width and insulation distance in the semiconductor module in the first embodiment. Each of FIGS. 13A through 13C is a fragmentary schematic sectional view of the portion at which the semiconductor module and the capacitor are connected. Each of FIGS. 13A through 13C illustrates only one (right half) of halves into which the portion at which the semiconductor module and the capacitor are connected is divided.

As illustrated in FIG. 13A, it is assumed that when the width of the first terminal 13A of the semiconductor module 10A and the third terminal 23 of the capacitor 20 connected thereto is Wb in the semiconductor device 1A (FIGS. 8 through 11), insulation distance along the second insulating paper 24 between the first terminal 13A and the third terminal 23 (N terminals) and the intermediate portion 33 of the connecting member 30 (P terminal) is Lb.

As illustrated in FIG. 13B, when the width Wa of the first terminal 13 of the semiconductor module 10 in the semiconductor device 1 (FIGS. 1 through 7) is larger than the width Wb of the first terminal 13A in the above semiconductor device 1A, the effect of realizing a reduction in inductance caused by an increase in the cross-sectional area of the first terminal 13 while ensuring insulation distance is obtained if insulation distance La along the first insulating paper 14 and the second insulating paper 24 is longer than insulation distance Lb along the second insulating paper 24 in the above semiconductor device 1A or insulation distance Lb along the second insulating paper 24 in the semiconductor device 1.

As illustrated in FIG. 13C, when the width Wa of the first terminal 13 of the semiconductor module 10 in the semiconductor device 1 (FIGS. 1 through 7) is expanded further, the effect of realizing a reduction in inductance caused by an increase in the cross-sectional area of the first terminal 13 while ensuring insulation distance is obtained as long as insulation distance La along the first insulating paper 14 and the second insulating paper 24 is longer than insulation distance Lb along the second insulating paper 24 in the above semiconductor device 1A or insulation distance Lb along the second insulating paper 24 in the semiconductor device 1.

However, when the width Wa of the first terminal 13 of the semiconductor module 10 in the semiconductor device 1 is expanded, insulation distance La along the first insulating paper 14 and the second insulating paper 24 may become shorter than insulation distance Lb along the second insulating paper 24 in the above semiconductor device 1A or insulation distance Lb along the second insulating paper 24 in the semiconductor device 1. In this case, on the one hand, the effect of realizing a reduction in inductance caused by an increase in the cross-sectional area of the first terminal 13 is obtained, but on the other hand, insulation distance is not ensured. In order to reduce inductance while ensuring insulation distance in the semiconductor device 1, the width Wa of the first terminal 13 of the semiconductor module 10 may be expanded until insulation distance La along the first insulating paper 14 and the second insulating paper 24 becomes equal to insulation distance Lb along the second insulating paper 24 in the above semiconductor device 1A or insulation distance Lb along the second insulating paper 24 in the semiconductor device 1.

The semiconductor device 1 according to the first embodiment and the semiconductor module 10 and the capacitor 20 included therein have been described.

In the semiconductor device 1, according to the above description, the first terminal 13 of the semiconductor module 10 and the third terminal 23 of the capacitor 20 are N terminals and the second terminal 15 of the semiconductor module 10, the fourth terminal 25 of the capacitor 20, and the connecting member 30 are P terminals. In the semiconductor device 1, however, the first terminal 13 of the semiconductor module 10 and the third terminal 23 of the capacitor 20 may be P terminals and the second terminal 15 of the semiconductor module 10, the fourth terminal 25 of the capacitor 20, and the connecting member 30 may be N terminals.

Second Embodiment

Figure 14A:
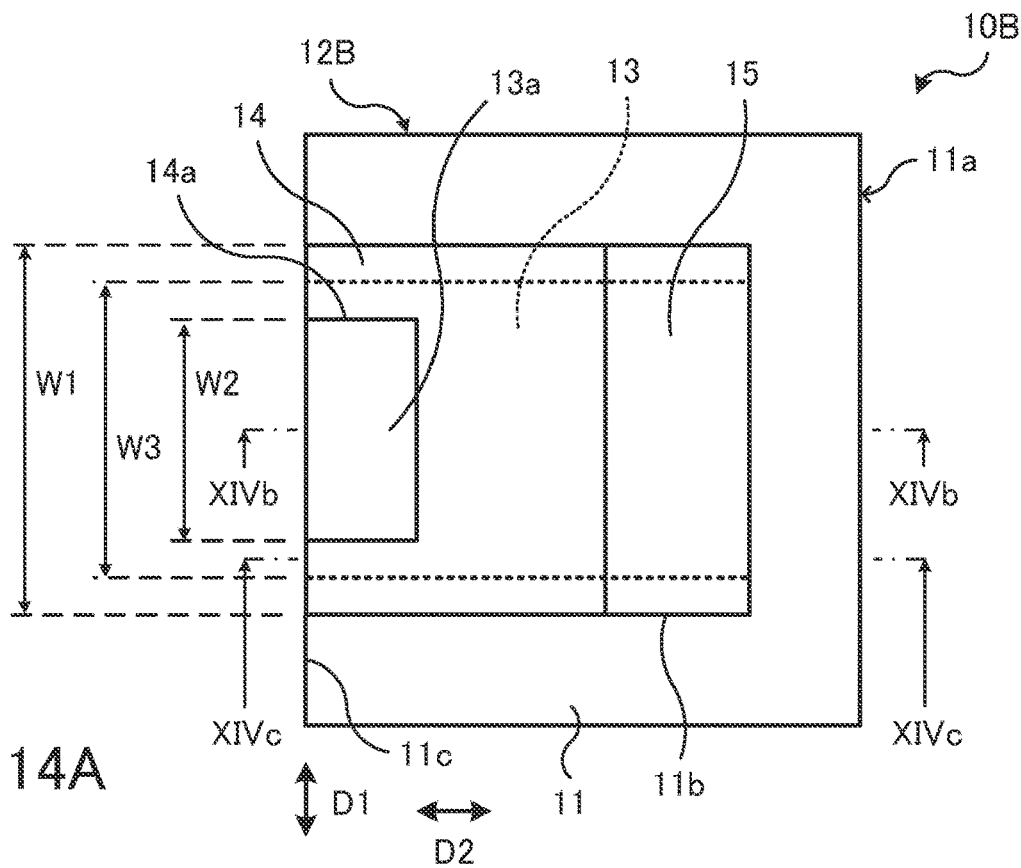
FIGS. 14A through 14C are views for describing an example of a terminal structure portion of a semiconductor module in a second embodiment.
Figure 14B:
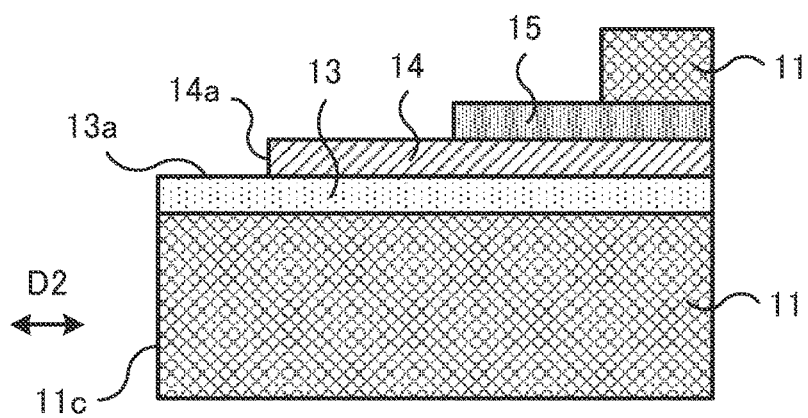
Figure 14C:
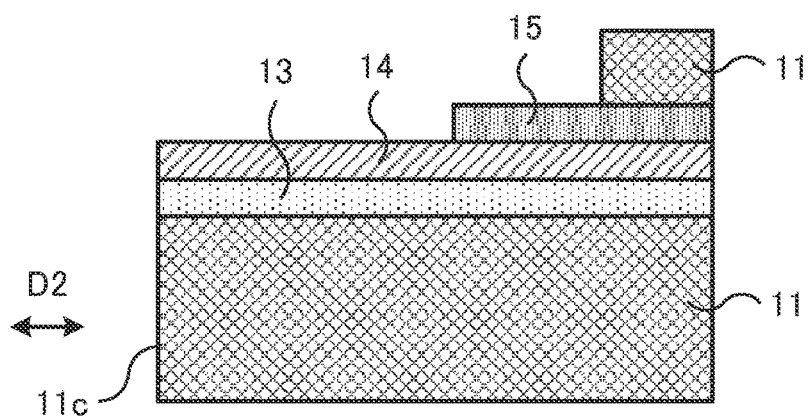

FIGS. 14A through 14C are views for describing an example of a terminal structure portion of a semiconductor module in a second embodiment. FIG. 14A is a fragmentary schematic plan view of an example of a terminal structure portion of a semiconductor module. FIG. 14B is a schematic sectional view taken along the line XIVb-XIVb of FIG. 14A. FIG. 14C is a schematic sectional view taken along the line XIVc-XIVc of FIG. 14A.

A terminal structure portion 12B of a semiconductor module 10B illustrated in FIGS. 14A through 14C differs from the terminal structure portion 12 of the semiconductor module 10 described in the above first embodiment in that a first terminal 13 and a first insulating paper 14 which covers the first terminal 13 in a state in which a connecting area 13a of the first terminal 13 is situated under a notch 14a do not extend outward from a first case 11.

In the terminal structure portion 12B of the semiconductor module 10B, the first terminal 13, a second terminal 15, and the first insulating paper 14 put therebetween are located in a concave portion 11b formed in a first edge portion 11a of the first case 11. An end portion of each of the first terminal 13, the first insulating paper 14, and the second terminal 15 may be buried in a side wall portion of the concave portion 11b of the first case 11. In the terminal structure portion 12B of the semiconductor module 10B, the width of the first terminal 13 is set to a third width W3 smaller than a first width W1 of the first insulating paper 14 and larger than a second width W2 of the notch 14a of the first insulating paper 14.

In accordance with the example described in the above first embodiment, a third terminal 23 of a capacitor 20 is connected to the connecting area 13a of the first terminal 13 of the semiconductor module 10B exposed from the notch 14a of the first insulating paper 14 and the second terminal 15 of the semiconductor module 10B and a fourth terminal 25 of the capacitor 20 are connected by a connecting member 30 including an intermediate portion 33 opposite a portion at which the first terminal 13 and the third terminal 23 are connected. As a result, a semiconductor device including the semiconductor module 10B and the capacitor 20 connected to each other is realized.

As with the terminal structure portion 12B of the semiconductor module 10B, the first terminal 13, the second terminal 15, and the first insulating paper 14 put therebetween may be located in the concave portion 11b formed in the first edge portion 11a of the first case 11.

Third Embodiment

Figure 15:
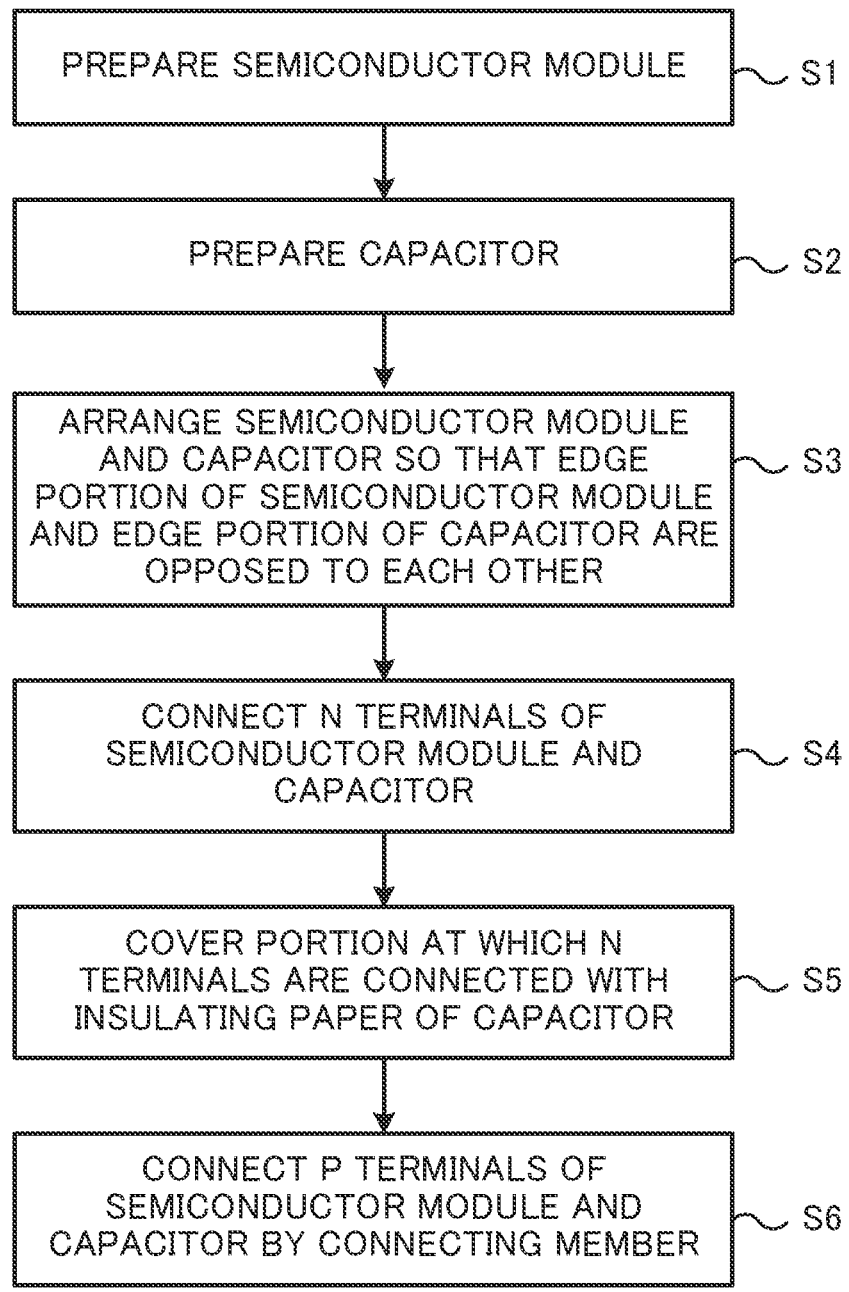
FIG. 15 is a view for describing an example of a method for manufacturing a semiconductor device, according to a third embodiment.

An example of a method for manufacturing the above semiconductor device 1 or the like will now be described as a third embodiment. FIG. 15 is a view for describing an example of a method for manufacturing a semiconductor device, according to a third embodiment.

First, as an example, the semiconductor module 10 illustrated in FIGS. 2A through 2C in the above first embodiment is prepared (step S1). That is to say, the semiconductor module 10 in which the above first terminal 13, second terminal 15, and the first insulating paper 14 put therebetween and having the notch 14a from which the connecting area 13a of the first terminal 13 is exposed are located on the first edge portion 11a of the first case 11 is prepared.

Furthermore, the capacitor 20 which is illustrated in FIGS. 3A and 3B in the above first embodiment and which is to be connected to the semiconductor module 10 is prepared (step S2). That is to say, the capacitor 20 in which the above third terminal 23, second insulating paper 24, and fourth terminal 25 are located on the second edge portion 21a of the second case 21 is prepared.

The order of step S1 and step S2 is not limited. Any one of them may be performed before the other.

Next, the semiconductor module 10 and the capacitor 20 prepared are arranged so that the first edge portion 11a of the first case 11 of the semiconductor module 10 and the second edge portion 21a of the second case 21 of the capacitor 20 will be opposed to each other (step S3).

In addition, the connecting area 13a of the first terminal 13 of the semiconductor module 10 exposed from the notch 14a of the first insulating paper 14 and the third terminal 23 of the capacitor 20 are connected (step S4). For example, the first terminal 13 of the semiconductor module 10 and the third terminal 23 of the capacitor 20 are both N terminals and N terminals of the semiconductor module 10 and the capacitor 20 are connected in step S4.

Next, the second insulating paper 24 of the capacitor 20 is bent to the side of a portion at which the first terminal 13 of the semiconductor module 10 and the third terminal 23 of the capacitor 20 are connected, and the portion at which the first terminal 13 of the semiconductor module 10 and the third terminal 23 of the capacitor 20 are connected is covered with the second insulating paper 24 (step S5). In step S5, the third terminal 23, the connecting area 13a of the first terminal 13 connected to the third terminal 23, and the first insulating paper 14 which covers the first terminal 13 so that the connecting area 13a will be situated under the notch 14a are covered with the second insulating paper 24 bent.

Next, the second terminal 15 of the semiconductor module 10 and the fourth terminal 25 of the capacitor 20 are connected by the use of the above connecting member 30 (step S6). For example, the second terminal 15 of the semiconductor module 10 and the fourth terminal 25 of the capacitor 20 are both P terminals and P terminals of the semiconductor module 10 and the capacitor 20 are connected in step S6. The connecting member 30 functions as a P terminal. In step S6, the connecting member 30 is arranged so as to extend across the portion at which the first terminal 13 of the semiconductor module 10 and the third terminal 23 of the capacitor 20 are connected and the second insulating paper 24 of the capacitor 20 which covers the first insulating paper 14 of the semiconductor module 10, and is connected to the second terminal 15 of the semiconductor module 10 and the fourth terminal 25 of the capacitor 20.

For example, a method including steps S1 through S6 is used for manufacturing the semiconductor device 1.

A case where the semiconductor module 10 described in the first embodiment is connected to the capacitor 20 has been taken as an example. However, the semiconductor module 10B described in the above second embodiment may be connected to the capacitor 20 in the same way.

Furthermore, the first terminal 13 of the semiconductor module 10 and the third terminal 23 of the capacitor 20 are considered as N terminals and the second terminal 15 of the semiconductor module 10, the fourth terminal 25 of the capacitor 20, and the connecting member 30 are considered as P terminals. However, the first terminal 13 of the semiconductor module 10 and the third terminal 23 of the capacitor 20 may be considered as P terminals and the second terminal 15 of the semiconductor module 10, the fourth terminal 25 of the capacitor 20, and the connecting member 30 may be considered as N terminals. In this case, P terminals of the semiconductor module 10 and the capacitor 20 are connected in step S4 and N terminals of the semiconductor module 10 and the capacitor 20 are connected in step S6.

According to an aspect, a semiconductor device which reduces inductance while ensuring insulation distance is realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a semiconductor module including:
      a first case having a first side face;
      a first insulating paper disposed on the first case, and having a first width in a first direction that is parallel to the first side face, the first insulating paper having a notch that is concave from the first side face toward an inside of the first case in a second direction orthogonal to the first direction and the first side face and that has a second width in the first direction that is smaller than the first width;
      a first terminal disposed between the first case and the first insulating paper and having an exposed portion that is exposed from the first insulating paper at an area where the notch is formed, the first terminal having a third width in the first direction that is smaller than the first width and larger than the second width; and
      a second terminal disposed on the first insulating paper at a side opposite to a side at which the first terminal is disposed, wherein:
   the first terminal has an extended portion that extends in the second direction to an outside of the first case from the first side face, and
   the first insulating paper has an extended portion that extends in the second direction to the outside of the first case from the first side face, so that a portion of the first insulating paper where the notch is formed and the exposed portion of the first terminal are both located at the outside of the first case.

2. The semiconductor device according to claim 1, wherein the first insulating paper has a shape of a letter "U" in a plan view of the semiconductor device.

3. The semiconductor device according to claim 1, wherein:
   the extended portion of the first insulating paper has the first width; and
   the extended portion of the first terminal has the third width.

4. The semiconductor device according to claim 3, wherein an overlapped portion of the first insulating paper overlapping the first case in a plan view of the semiconductor device has a fourth width in the first direction that is smaller than the first width.

5. The semiconductor device according to claim 1, wherein the first terminal and the second terminal differ in polarity.

6. The semiconductor device according to claim 1, further comprising:
   a capacitor electrically connected to the semiconductor module, the capacitor including:

a second case having a second side face that faces the first side face of the first case;

a third terminal disposed on the second case, and being connected to the exposed portion of the first terminal exposed from the notch of the first insulating paper;

a second insulating paper which covers the third terminal and a part of the first terminal; and a fourth terminal disposed on the second case at a position that is farther away from the second side face than is a position of the third terminal; and a conductive connecting member which extends across the second insulating paper and which connects the second terminal to the fourth terminal.

7. The semiconductor device according to claim 6, wherein a portion of the third terminal that is connected to the exposed portion of the first terminal has a fifth width in the first direction that is smaller than the third width of the first terminal.

8. The semiconductor device according to claim 6, wherein a portion of the connecting member facing the first terminal has a sixth width in the first direction that is smaller than the third width of the first terminal.

9. The semiconductor device according to claim 6, wherein on a cross section taken in the first direction along a line passing through the notch in the second direction, a first insulation distance from the connecting member to the first terminal along the second insulating paper and the first insulating paper is longer than or equal to a second insulation distance from the connecting member to the third terminal along the second insulating paper.

10. A semiconductor device manufacturing method, comprising:

preparing a semiconductor module, the semiconductor module including:

a first case having a first side face;

a first insulating paper disposed on the first case, and having a first width in a first direction that is parallel to the first side face, the first insulating paper having a notch that is concave from the first side face toward an inside of the first case in a second direction orthogonal to the first direction and the first side face, and has a second width in the first direction that is smaller than the first width;

a first terminal, covered by the first insulating paper and having an exposed portion that is exposed from the first insulating paper at an area where the notch is formed, the first terminal having a third width in the first direction that is smaller than the first width and larger than the second width; and a second terminal disposed on the first insulating paper at a side opposite to a side at which the first terminal is disposed, wherein:

the first terminal has an extended portion that extends in the second direction to an outside of the first case from the first side face, and the first insulating paper has an extended portion that extends in the second direction to the outside of the first case from the first side face, so that a portion of the first insulating paper where the notch is formed and the exposed portion of the first terminal are both located at the outside of the first case, arranging a capacitor including a second case with a second side face so that the second side face faces the first side face of the first case, the capacitor including:

the second case with the second side face;

a third terminal disposed on the second case;

a fourth terminal disposed on the second case at a position that is farther away from the second side face than is a position of the third terminal; and a second insulating paper;

connecting the third terminal to the exposed portion of the first terminal exposed from the first insulating paper;

covering the third terminal and a part of the first terminal with the second insulating paper; and connecting the second terminal to the fourth terminal with a conductive connecting member so that the conductive connecting member extends across the second insulating paper.

11. The semiconductor device manufacturing method according to claim 10, wherein a portion of the third terminal connected to the exposed portion of the first terminal has a fourth width in the first direction that is smaller than the third width of the first terminal.

12. The semiconductor device manufacturing method according to claim 10, wherein a portion of the connecting member facing the first terminal has a fifth width in the first direction that is smaller than the third width of the first terminal.

13. The semiconductor device manufacturing method according to claim 10, wherein on a cross section taken in the first direction along a line passing through the notch in the second direction, a first insulation distance from the connecting member to the first terminal along the second insulating paper and the first insulating paper is longer than or equal to a second insulation distance from the connecting member to the third terminal along the second insulating paper.

* * * * *